(12) United States Patent
Iwasaki et al.

(10) Patent No.: US 7,645,048 B2
(45) Date of Patent: Jan. 12, 2010

(54) PLANAR LIGHTING DEVICE

(75) Inventors: Osamu Iwasaki, Kanagawa (JP);
Takamitsu Okumura, Kanagawa (JP);
Toshiaki Endo, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 112 days.

(21) Appl. No.: 11/940,702

(22) Filed: Nov. 15, 2007

(65) Prior Publication Data

US 2008/0112153 A1 May 15, 2008

(30) Foreign Application Priority Data

Nov. 15, 2006 (JP) .............................. 2006-309476

(51) Int. Cl.
*G01D 11/28* (2006.01)
(52) U.S. Cl. ........................ 362/84; 362/614; 362/608
(58) Field of Classification Search .................. 362/84, 362/612–614, 624, 625, 628, 608, 610, 330, 362/97.1–97.4, 34; 349/69, 70, 71
See application file for complete search history.

(56) References Cited

U.S. PATENT DOCUMENTS

| 5,993,020 | A | 11/1999 | Koike |
| 6,217,184 | B1 | 4/2001 | Koike |
| 6,871,972 | B2 * | 3/2005 | Ju ................................ 362/26 |
| 6,871,973 | B2 * | 3/2005 | Ju ................................ 362/26 |
| 7,360,937 | B2 * | 4/2008 | Han et al. .................... 362/608 |
| 2003/0012008 | A1 * | 1/2003 | Chang et al. .................. 362/27 |
| 2004/0100788 | A1 * | 5/2004 | Ju ................................ 362/31 |
| 2004/0100789 | A1 * | 5/2004 | Ju ................................ 362/31 |

FOREIGN PATENT DOCUMENTS

| JP | 7-36037 A | 2/1995 |
| JP | 8-248233 A | 9/1996 |
| JP | 8-271739 A | 10/1996 |
| JP | 11-153963 A | 6/1999 |

* cited by examiner

*Primary Examiner*—Bao Q Truong
(74) *Attorney, Agent, or Firm*—Sughrue Mion, PLLC

(57) ABSTRACT

The planar lighting device includes a light source having at least one LED chip for emitting blue light through a light emission face, a transparent light guide plate having at least one light entrance plane through which light emitted by the light source is admitted and a light exit plane through which the light admitted through the at least one light entrance plane is emitted as planar light, and a fluorescent member disposed between the light emission face and each of the at least one light entrance plane and having a fluorescent substance coated area for emitting white light by converting the blue light from the light source into the white light and blue light passing areas through which the blue light from the light source is allowed to pass as the blue light.

15 Claims, 18 Drawing Sheets

FIG.13A
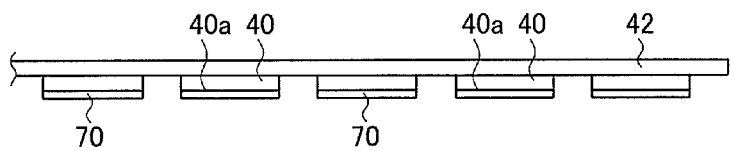
FIG.13B     FIG.13C
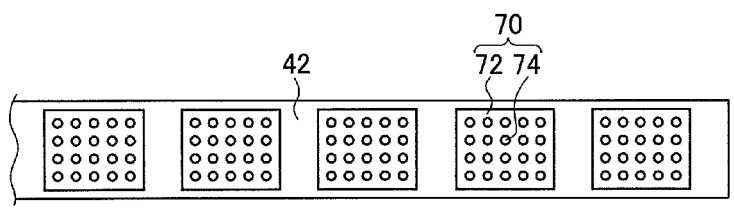 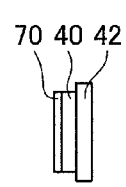
FIG.14A
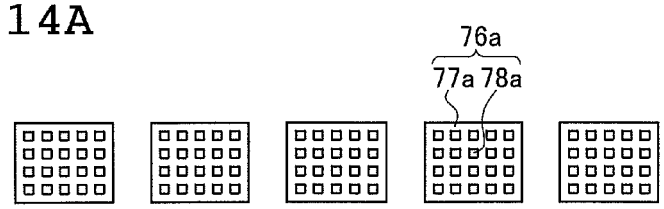
FIG.14B
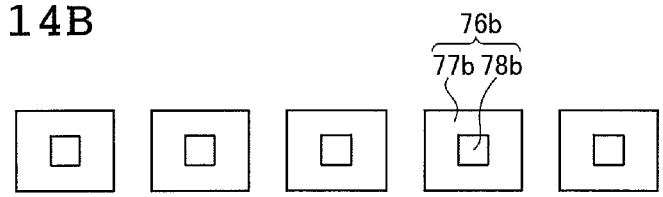
FIG.14C
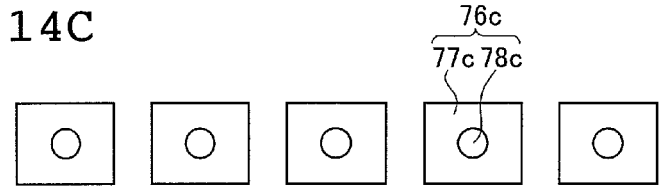

PLANAR LIGHTING DEVICE

BACKGROUND OF THE INVENTION

The present invention relates to a planar lighting device having a light guide plate that diffuses light emitted by a light source and radiates illuminating light through a light exit plane thereof and more particularly to a planar lighting device used as a planar lighting device for indoor and outdoor illumination, or a planar lighting device used as a backlight unit in liquid crystal display panels, advertising panels, advertising towers and advertising signs.

Liquid crystal display devices use a backlight unit for radiating light from behind the liquid crystal display panel to illuminate the liquid crystal display panel. A backlight unit is configured using optical members comprising a light guide plate for diffusing light emitted by an illuminating light source to irradiate the liquid crystal display panel, a prism sheet, and a diffusion sheet.

Currently, large liquid crystal display televisions predominantly use a so-called direct illumination type backlight unit having no light guide plate but comprising optical members such as a diffusion plate disposed immediately above the illuminating light source. This type of backlight unit comprises cold cathode tubes serving as a light source provided on the rear side of the liquid crystal display panel whereas the inside of the backlight unit provides white reflection surfaces to ensure uniform light amount distribution and a necessary brightness.

To achieve a uniform light amount distribution with the direct illumination type backlight unit, however, the backlight unit needs to have a given thickness, say about 30 mm, in a direction perpendicular to the liquid crystal display panel. While demands of still thinner backlight units are expected to grow in the future, achieving a further reduced thickness of say 10 mm or less with a backlight unit is deemed difficult in view of uneven light amount distribution expected to accompany the direct illumination type.

Thus, a backlight unit of a type that uses a light guide plate formed of a material prepared by mixing scattering particles to diffuse light into a transparent resin has been proposed, for which reference may be had, for example, to JP 07-36037 A, JP 08-248233 A, JP 08-271739 A, and JP 11-153963 A.

JP 07-36037 A, for example, discloses a light diffusion light guide light source device comprising a light diffusion light guide member having at least one light entrance plane region and at least one light exit plane region and light source means for admitting light through the light entrance plane region, the light diffusion light guide member having a region that has a tendency to decrease in thickness with the increasing distance from the light entrance plane.

JP 08-248233 A discloses a planar light source device comprising a light diffusion light guide member, a prism sheet provided on the side of the light diffusion light guide member closer to a light exit plane, and a reflector provided on the rear side of the light diffusion light guide member. JP 08-271739 A discloses a liquid crystal display comprising a light emission direction correcting element formed of sheet optical materials provided with a light entrance plane having a repeated undulate pattern of prism arrays and a light exit plane given a light diffusing property. JP 11-153963 A discloses a light source device comprising a light diffusion light guide member having a scattering power therein and light supply means for supplying light through an end plane of the light diffusion light guide member.

In the planar lighting devices mentioned above, light emitted by the light source and admitted through the light entrance plane into the light diffusion light guide member receives a single or a multiple scattering effect at a given rate as the light propagates through the inside of the light diffusion light guide member. Moreover, a significant proportion of light that reaches both end planes of the diffusion light guide member or a surface of the reflector receives reflection effect and is returned back into the diffusion light guide member.

The above composite process produces light beam that is emitted through the light exit plane highly efficiently with a directivity to travel obliquely forward as viewed from the light source. Briefly, light radiated by the light source is emitted through the light exit plane of the light diffusion light guide member.

Thus, the prior art literature mentioned above purportedly states that a light guide plate containing scattering particles mixed therein is capable of emitting uniform light with a high light emission efficiency.

As regards the light guide plate used in the planar lighting device, there have been disclosed a light guide plate in the form of a flat plate and a light guide plate composed of a portion shaped to have a region with a tendency to grow thinner with the increasing distance from the light entrance plane attached to the other portion, in addition to the light guide plate mentioned above that is shaped to have a region with a tendency to grow thinner with the increasing distance from the light entrance plane.

SUMMARY OF THE INVENTION

Besides fluorescent tubes such as cold cathode tubes, light emitting diodes (hereinafter referred to also as "LEDs") may also be used to provide a light source for supplying light into the light guide plate used in the planar lighting devices as mentioned above.

Use of LEDs, which are capable of emitting light having a high directivity, to provide a light source, enables light admitted into the light guide plate to be guided deeper into the light guide plate and hence a larger planar lighting device to be designed. Another advantage is a simple configuration of the power supply.

To produce white light using an LED, one may use a configuration in which a blue light emitting diode (hereinafter referred to also as "blue LED") is used with YAG (yttrium aluminum garnet) fluorescent substance to convert the blue light emitted by the blue light emitting diode into white light through the YAG fluorescent substance.

Using a blue LED together with the fluorescent substance as mentioned above provides a simple configuration to emit white light.

However, light emitted using a blue LED together with the fluorescent substance as mentioned above has problems that light thus emitted has a low color temperature and that it is difficult to adjust the color temperature without reducing light use efficiency. Accordingly, light emitted through the light exit plane of the planar lighting device has a low color temperature and the adjustment thereof is difficult.

Further, the shape having a tendency to decrease in thickness with the increasing distance from a position at which light from the light source enters or the flat plate shape as disclosed in the prior art literature mentioned above also pose a problem that a limited distance that light is capable of traveling limits the extent to which the dimensions of the planar lighting device can be increased.

Still further, to achieve increased dimensions with the planar lighting devices using the light guide plates disclosed in the above prior art literature, light needs to travel a longer distance from the light source, which in turn requires the light guide plates themselves to be made thicker. Thus, there still remains a problem that it is impossible to increase the dimensions and reduce the thickness and weight of a planar lighting device.

Thus, an object of the present invention is to provide a planar lighting device that eliminates the problems encountered by the above prior art, and which is capable of emitting light having a desired color temperature with a simple configuration, and with which an enhanced light use efficiency can be achieved.

Another object of the present invention is to provide a thin and lightweight planar lighting device that is capable of emitting uniform illuminating light free from brightness unevenness and which allows increase in dimensions in addition to achieving the above object.

Yet another object of the present invention is to provide a planar lighting device allowing an efficient use of light emitted by the light source and, furthermore, capable of emitting light with a higher brightness through a light exit plane in addition to achieving the above objects.

In order to achieve the above-mentioned object, according to an aspect of the present invention, there is provided a planar lighting device comprising:

a light source having at least one LED chip that emits blue light through a light emission face, a transparent light guide plate comprising at least one light entrance plane for admitting light emitted by the light source and a light exit plane for emitting light admitted through the at least one light entrance plane as planar light, a fluorescent member disposed between the light emission face and each of the at least one light entrance plane and comprising a fluorescent substance coated area for emitting white light by converting the blue light emitted through the light emission face into the white light and blue light passing areas for emitting the blue light emitted through the light emission face as the blue light.

In the above image processing apparatus, the blue light passing areas are preferably formed of a transparent film or apertures.

Preferably, the light source comprises two or more LED chips and a mount for supporting the two or more LED chips, and the two or more LED chips are arranged in an array on a surface of the mount facing each of the at least one light entrance plane.

Further, the fluorescent member preferably has two or more blue light passing areas formed therein for the light emission face of each LED chip.

The fluorescent member is preferably a single sheet member common to the LED chips.

The fluorescent member is preferably provided for each of the LED chips.

Further, the fluorescent member is preferably formed such that Sa and Sap satisfy a relation $0.05 \leq Sap/Sa \leq 0.40$, where Sa is a whole area of the fluorescent member and Sap is a sum of areas of all the blue light passing areas.

Further, the fluorescent member is preferably arranged in contact with the light emission face. Still further, the fluorescent member is preferably arranged in contact with the light entrance plane.

Preferably, the at least one light entrance plane of the light guide plate is formed at an end of the light exit plane for emitting the planar light therethrough, is substantially perpendicular to the light exit plane and admits the light traveling parallel to the light exit plane, and the light guide plate has a shape growing thicker in a direction perpendicular to the light exit plane with an increasing distance from the at least one light entrance plane.

Further, the light guide plate preferably comprises the light exit plane for emitting planar light therethrough, the light entrance plane formed at an end of the light exit plane for admitting light entering from a position substantially perpendicular to the light exit plane and traveling parallel to the light exit plane, and a inclined plane disposed on the opposite side from the light exit plane and so inclined as to be distanced farther from the light exit plane with the increasing distance from the light entrance plane.

Further, the light guide plate preferably contains scattering particles therein and satisfies following expressions:

$$1.1 \leq \Phi \cdot N_p \cdot L_G \cdot K_C \leq 8.2$$

$$0.005 \leq K_C \leq 0.1;$$

where $\Phi$ is a scattering cross section of the scattering particles; $N_p$ is a density of the scattering particles; $K_C$ is a compensation coefficient; and $L_G$ is a distance in an incident direction from the at least one light entrance plane of the light guide plate to a position where the light guide plate is thickest.

Preferably, the at least one LED chip has the light emission face longer than a length of the at least one light entrance plane in an effective cross section passing through the end of the light exit plane at which the at least one light entrance plane is formed and lying in the direction substantially perpendicular to the light exit plane, and the light emission face is disposed opposite the at least one light entrance plane of the light guide plate and tilted a given angle with respect to the direction substantially perpendicular to the light exit plane.

Preferably, the at least one light entrance plane of the light guide plate is a plane substantially perpendicular to the light exit plane and the effective cross section of the at least one light entrance plane is the plane substantially perpendicular to the light exit plane.

Preferably, the at least one light entrance plane of the light guide plate is a plane inclined with respect to the direction substantially perpendicular to the light exit plane such that the at least one light entrance plane faces and is parallel to the light emission face of the light source and an effective cross section of each of the at least one light entrance plane is a cross section lying in a plane passing through a center of each of the at least one light entrance plane and substantially perpendicular to the light exit plane.

Further, an inclination angle of the light emission face of the light source with respect to the direction substantially perpendicular to the light exit plane is preferably 15° to 90°.

The planar lighting device preferably further comprises light guide reflection plates for guiding the light emitted by the light source to the at least one light entrance plane, disposed on a side of the at least one light entrance plane of the light guide plate closer to the light exit plane and on a side of the at least one light entrance plane opposite from the light exit plane.

Further, the light guide reflection plates preferably comprise a first light guide reflection plate attached to an end of the light exit plane of the light guide plate and a second light guide reflection plate attached to an end of a plane of the light guide plate opposite from the light exit plane and having an extension extending farther outward from an end of the plane of the light guide plate opposite from the light exit plane.

Further, the light guide plate preferably has a configuration such that the light exit plane is rectangular and the at least one light entrance plane of the light guide plate comprises a first light entrance plane and a second light entrance plane each formed on two opposite sides of the light exit plane, and that the light guide plate is thinnest at the first light entrance plane and the second light entrance plane and thickest at a midpoint of a line connecting the first light entrance plane and the second light entrance plane.

Further, the light guide plate preferably comprises the light exit plane for emitting planar light therethrough and the lateral plane formed at an end of the light exit plane and formed an angle greater than 90° with the light exit plane, the inclined plate disposed on the opposite side from the light exit plane and so inclined as to be distanced farther from the light exit plane with the increasing distance from the lateral plane, and the light entrance plane formed between the lateral plane and the inclined plate for admitting light.

According to the present invention, part of the light emitted by an LED can be radiated as blue light by forming blue light passing areas in a fluorescent member for converting blue light emitted by the LED into white light. This enables the planar lighting device to emit light with a high color temperature. Further, the color temperature can be adjusted merely by forming the blue light passing areas in the fluorescent member. Thus, adjustment is simple and the configuration of the device can be made simple.

Still further, according to the present invention, light admitted through the light entrance plane can be allowed to travel deeper into the light guide plate by providing the light guide plate with a shape growing thicker in the direction perpendicular to the light exit plane with the increasing distance from the light entrance plane of the light guide plate, achieving a thin design with a large light exit plane.

Further, light can be admitted with a high efficiency by disposing a light emission face of the light source tilted a given angle with respect to a direction perpendicular to the light exit plane, even when using the light source with the light emission face longer than the length of the light entrance plane in the effective cross section. To be brief, a high light use efficiency is achieved. Further still, the amount of light emitted through the light emission face can be increased by increasing the area of the light emission face.

Thus, according to the present invention, light with a high brightness or high illuminance can be efficiently emitted through the light exit plane while achieving a thin design of the device.

BRIEF DESCRIPTION OF THE DRAWINGS

These and other objects, features, and advantages of the present invention will be apparent from the following detailed description and accompanying drawings in which:

FIG. 8A is a top plan view, FIG. 8B is a front view, and FIG. 8C is an elevation.

FIGS. 13A to 13C illustrate part of another example of the fluorescent member and the light source. FIG. 13A is a top plan view, FIG. 13B is a front view, and FIG. 13C is an elevation.

FIGS. 14A to 14C are front views of other examples of the fluorescent member.

DETAILED DESCRIPTION OF THE INVENTION

Now, preferred embodiments of the planar lighting device according to the present invention will be described in detail by referring to the accompanying drawings.

Figure 1:
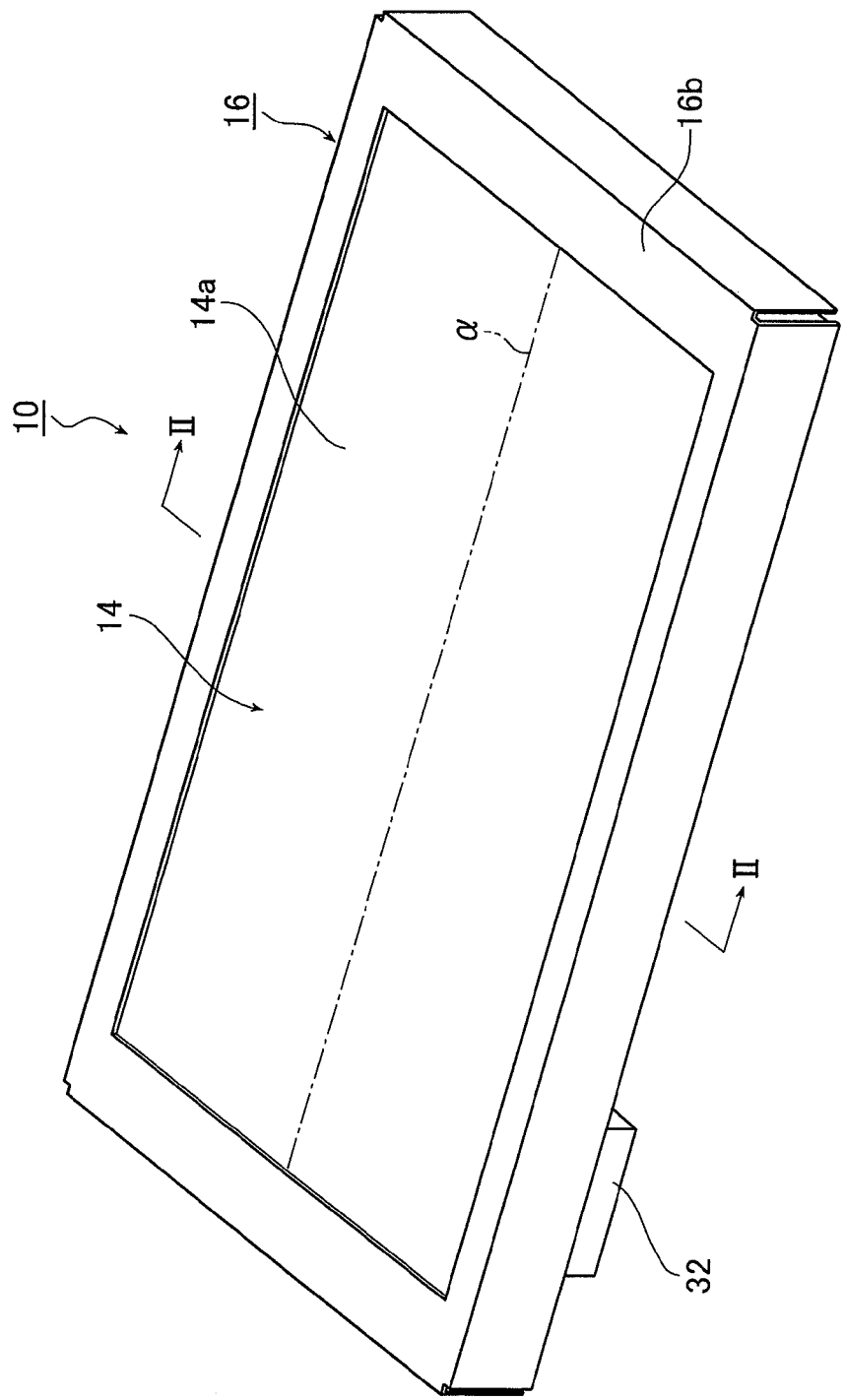
FIG. 1 is a schematic perspective view illustrating an embodiment of the inventive planar lighting device.
Figure 2:
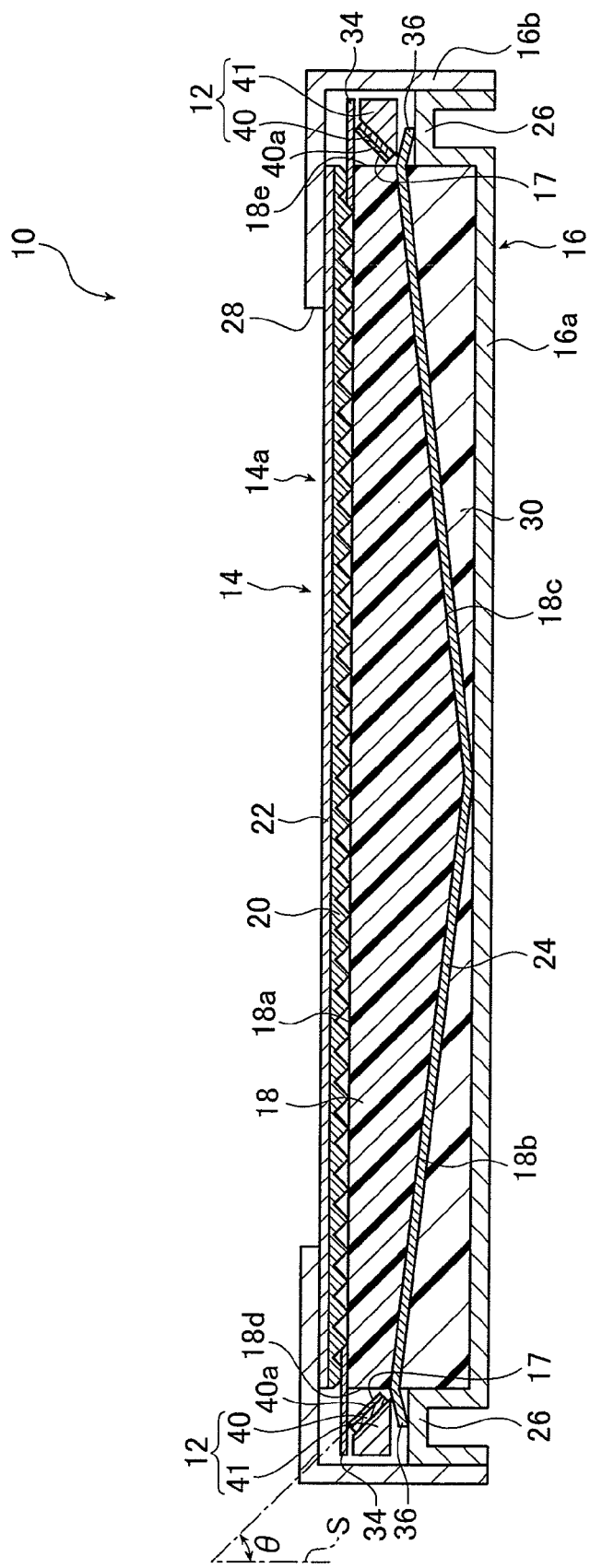
FIG. 2 is a sectional view of the planar lighting device illustrated in FIG. 1 taken along a line II-II.

FIG. 1 is a perspective view illustrating an embodiment of the inventive planar lighting device. FIG. 2 is a sectional view of the planar lighting device illustrated in FIG. 1 taken along the line II-II.

Figure 3:
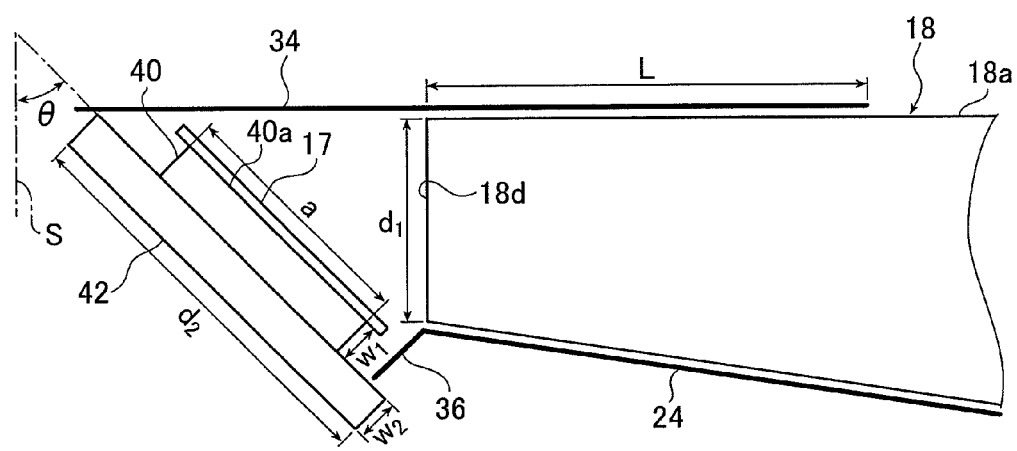
FIG. 3 is an enlarged sectional view illustrating part of the planar lighting device of FIG. 2 enlarged.

FIG. 3 is an enlarged sectional view illustrating part of the planar lighting device of FIG. 2 enlarged.

As illustrated in the drawings, a planar lighting device 10 comprises light sources 12, a main body 14 of the lighting device that emits uniform light through a rectangular light exit plane 14a, fluorescent members 17 disposed between the light sources 12 and the main body 14 of the lighting device, and a housing 16 accommodating therein the light sources 12, the main body 14 of the lighting device, and the fluorescent members 17. The housing 16 comprises a housing member 16a and a frame member 16b as will be described later.

The light sources 12 will be first described.

Figures 4A, 4B, 4C:
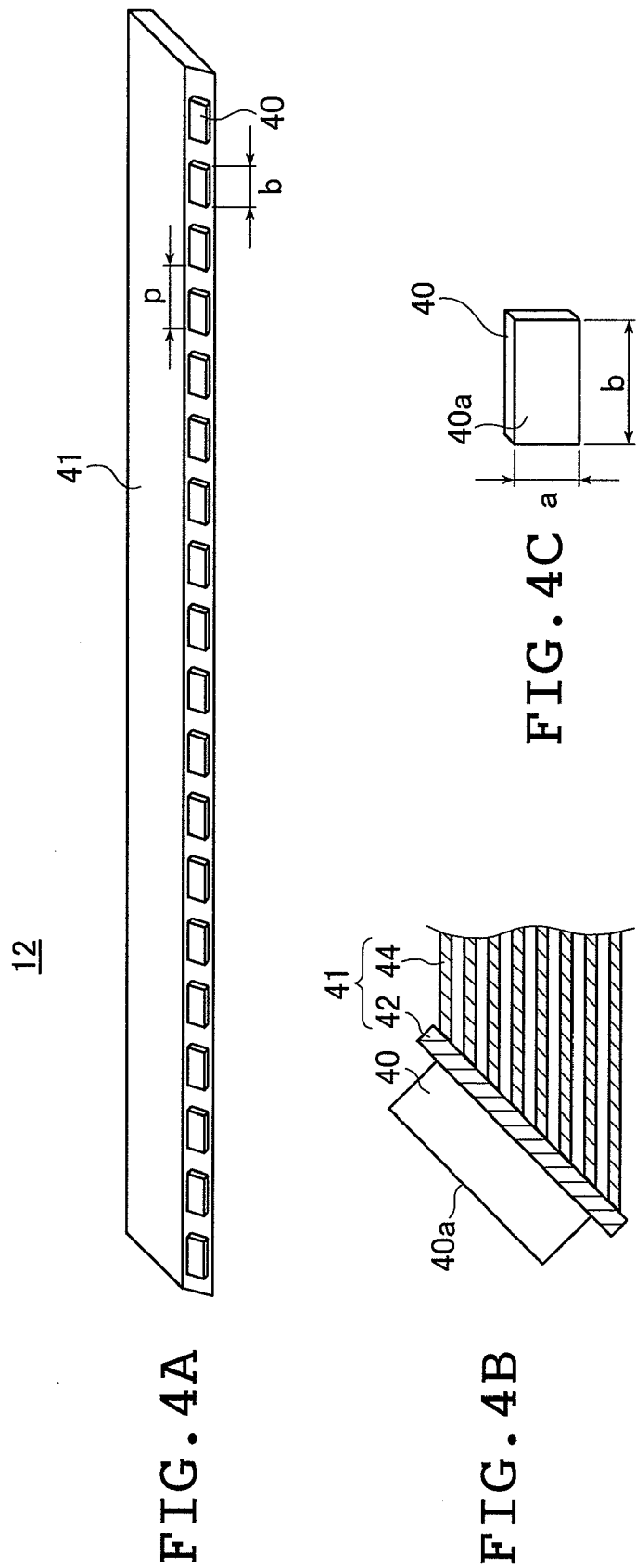
FIG. 4A is a perspective view schematically illustrating the configuration of a light source of the planar lighting device of FIGS. 1 and 2.
FIG. 4B is a sectional view of the light source illustrated in FIG. 4A.
FIG. 4C is a schematic perspective view illustrating one LED of the light source of FIG. 4A as enlarged.

FIG. 4A is a perspective view schematically illustrating the configuration of the light source 12 of the planar lighting device 10 of FIGS. 1 and 2, FIG. 4B is a sectional view of the light source 12 illustrated in FIG. 4A, and FIG. 4C is a perspective view schematically illustrating only one LED chip of the light source 12 of FIG. 4A as enlarged.

As illustrated in FIG. 4A, the light source 12 comprises chips 40 of light emitting diodes (referred to as "LED chips" below) and a light source mount 41.

The LED chip 40 is a chip of a light emitting diode that emits blue light. It has a light emission face 40a with a given area through which blue light is emitted. The LED chip 40 is exemplified by a GaN base light emitting diode and an InGaN base light emitting diode. In the present invention, blue light denotes light having, as emitted, a peak wavelength in a range of 420 nm inclusive to 500 nm inclusive. Light emitting diodes used in the present invention for emission of blue light preferably has a peak wavelength, as emitted, of 450 nm inclusive to 480 nm inclusive.

As illustrated in FIG. 4B, the light source mount 41 comprises an array base 42 and fins 44. The LED chips 40 are arranged in a single row at given intervals on the array base 42. Specifically, the LED chips 40 are arrayed along the longitudinal length of a first light entrance plane 18d or a second light entrance plane 18e of a light guide plate 18 to be described or parallel to a line in which a light exit plane 18a and the first light entrance plane 18d meet or a line in which the light exit plane 18a and the second light entrance plane 18e meet.

The array base 42 is a plate-like member disposed such that one side thereof faces a lateral end face of the light guide plate 18 where the light guide plate is thinnest: the array base 42 is disposed to face the first light entrance plane 18d or the second light entrance plane 18e defining the lateral end face of the light guide plate 18. The array base 42 carries the LED chips 40 on the side thereof facing the first light entrance plane 18d or the second light entrance plane 18e of the light guide plate 18.

The array base 42 according to the embodiment under discussion is formed of a metal having a good heat conductance, as exemplified by copper and aluminum. The array base 42 also acts as a heat sink to absorb heat generated by the LED chips 40 and releases the heat to the outside.

The fins 44 are plate-like members formed of a metal having a good heat conductance, as exemplified by copper and aluminum. The fins 44 are connected to the array base 42 on the side thereof opposite from the LED chips 40 and spaced a given distance from neighboring fins 44.

A plurality of fins 44 provided in the light source mount 41 ensure a large surface area and a high heat dissipation efficiency, increasing the efficiency with which the LED chips 40 are cooled.

The heat sink may be not only of air-cooled type but also of water-cooled type.

While the embodiment under discussion uses the array base 42 of the light source mount 41 as heat sink, a plate-like member without a heat-releasing function may form the array base in place of the array base having a function of a heat sink, where the LED chips need not be cooled.

As illustrated in FIG. 4C, the LED chips 40 of the embodiment under discussion each have a rectangular shape such that the sides perpendicular to the direction in which the LED chips 40 are arrayed are shorter than the sides lying in the direction in which the LED chips 40 are arrayed or, in other words, the sides lying in the direction of thickness of the light guide plate 18 to be described, i.e., the direction perpendicular to the light exit plane 18a, are the shorter sides. Expressed otherwise, the LED chips 40 each have a shape defined by "b">"a" where "a" denotes the length of the sides perpendicular to the light exit plane 18a of the light guide plate 18 and "b" denotes the length of the sides in the direction of the array. The distance "q" by which the arrayed LED chips 40 are spaced apart from each other satisfies "q">"b." Thus, the relation between the length "a" of the sides of the LED chips 40 perpendicular to the light exit plane 18a of the light guide plate 18, the length "b" of the sides in the direction of the array, and the distance "q" of the LED chips 40 by which the arrayed LED chips 40 are spaced apart from each other preferably satisfies "q">"b">"a."

Providing the LED chips 40 each in the form of a rectangle ensures generation of light in a great quantity with a thin design. A thin design of the light source, in turn, enables a thin design of a planar lighting device to be achieved.

While the LED chips 40 each preferably have a rectangular shape with the shorter sides lying in the direction of the thickness of the light guide plate 18 for a thinner design of the LED array or the light source, the present invention is not limited thereto, allowing the LED chips to have any shape as appropriate such as a square, a circle, a polygon, and an ellipse.

As illustrated in FIGS. 2 and 3, the LED chips 40 and the array bases 42 are disposed at a given angle with respect to the direction perpendicular to the light exit plane 18a of the light guide plate 18 to be described. Thus, the LED chips 40 are disposed such that their light emission faces 40a are tilted a given angle with respect to the direction perpendicular to the light exit plane 18a of the light guide plate 18 to be described. This will be described later in detail.

The light emission faces 40a of the LED chips 40 are provided with a fluorescent member 17. The fluorescent member 17 will be described later in detail.

As illustrated in FIG. 2, the main body 14 of the lighting device basically comprises the light guide plate 18, a prism sheet 20, a diffusion sheet 22, a reflection plate 24, upper light guide reflection plates 34, and lower light guide reflection plates 36.

These optical components forming the main body 14 of the lighting device will be described in detail below.

First, the light guide plate 18 will be described.

As illustrated in FIG. 2, the light guide plate 18 comprises the light exit plane 18a, which is flat and substantially rectangular; two light entrance planes, the first light entrance plane 18d and the second light entrance plane 18e, formed on both sides of the light exit plane 18a and substantially perpendicular to the light exit plane 18a; two inclined planes, a first inclined plane 18b and a second inclined plane 18c, disposed on the opposite side from the light exit plane 18a so as to be symmetrical to each other with respect to a central axis, a bisector α of the light exit plane 18a (see FIG. 1), which is parallel to the first light entrance plane 18d and the second light entrance plane 18e, and inclined a given angle with respect to the light exit plane 18a. The first inclined plane 18b and the second inclined plane 18c are so inclined as to be distanced farther from the light exit plane 18a with the increasing distance from the first light entrance plane 18d or the second light entrance plane 18e: expressed otherwise, the thickness of the light guide plate 18 in the direction perpendicular to the light exit plane increases from the first light entrance plane 18d or the second light entrance plane 18e toward the center of the light guide plate. Thus, the light guide plate 18 is thinnest at both sides thereof, i.e., at the first light entrance plane 18d and the second light entrance plane 18e, and thickest at the center, i.e., on the bisector α, where the first inclined plane 18b and the second inclined plane 18c meet. Yet otherwise expressed, the light guide plate 18 has a shape such that the thickness of the light guide plate 18 in the direction perpendicular to the light exit plane 18a increases with the increasing distance from the first light entrance plane 18d or the second light entrance plane 18e. The inclination angle of the first inclined plane 18b and the second inclined plane 18c with respect to the light exit plane 18a is not specifically limited.

The light sources 12 mentioned above are disposed opposite the first light entrance plane 18d and the second light entrance plane 18e of the light guide plate 18, respectively. Thus, the planar lighting device 10 has the two light sources 12 disposed in such a manner as to sandwich the light guide plate 18. In other words, the light guide plate 18 is placed between the two light sources 12 arranged opposite each other with a given distance between them.

The configuration of the light guide plate 18 growing thicker in the direction perpendicular to the light exit plane 18a with the increasing distance from the first light entrance plane 18d or the second light entrance plane 18e allows the light admitted through the light entrance plane to travel farther from the light entrance planes and, hence, enables a larger light exit plane to be achieved. Moreover, that the light entering through the light entrance plane is allowed to purposively travel a long distance from the light entrance plane enables a thinner design of the light guide plate to be achieved.

In the light guide plate 18 illustrated in FIG. 2, light entering through the first light entrance plane 18d and the second light entrance plane 18e travels through the inside of the light guide plate 18 as it is scattered by scatterers contained inside the light guide plate 18 as will be described in detail later and, directly or after being reflected by the first inclined plane 18b or the second inclined plane 18c, exits through the light exit plane 18a. Some light can in the process leak through the first inclined plane 18b and the second inclined plane 18c. It is then reflected by the reflection plate 24 covering the first inclined plane 18b and the second inclined plane 18c to enter the light guide plate 18 again.

The light guide plate 18 is formed of a transparent resin into which scattering particles are kneaded and dispersed. Transparent resin materials that may be used to form the light guide plate 18 include optically transparent resins such as PET (polyethylene terephthalate), PP (polypropylene), PC (polycarbonate), PMMA (polymethyl methacrylate), benzyl methacrylate, MS resins, and COP (cycloolefin polymer). The scattering particles kneaded and dispersed into the light guide plate 18 may be formed, for example, of TOSPEARL (trademark), silicone, silica, zirconia, or a derivative polymer. The light guide plate 18 containing the scattering particles is capable of emitting uniform illuminating light through the light exit plane with a greatly reduced level of brightness unevenness. The light guide plate 18 so formed may be manufactured using an extrusion molding method or an injection molding method.

Now, let Φ be the scattering cross section of scattering particles contained in the light guide plate 18; $L_G$ the length in the incident direction from the first light entrance plane 18d or the second light entrance plane 18e of the light guide plate 18 to a position where the thickness of the light guide plate 18 in the direction perpendicular to the light exit plane 18a is greatest, the incident direction, when expressed otherwise, being the direction parallel to the direction in which light entering the light guide plate travels and perpendicular to the line in which the light exit plane and the light entrance planes, i.e., the first light entrance plane or the second light entrance plane, meet, the length $L_G$ being, in the embodiment under discussion, a half of the length of the light guide plate in the incident direction, which in the embodiment under discussion is the direction perpendicular to the first light entrance plane 18d of the light guide plate 18, as also referred to as "direction of the optical axis" below, or, still otherwise expressed, the length as far as the bisector α; $N_p$ the density of the scattering particles contained in the light guide plate 18, the density denoting the number of particles in unit volume; and a compensation coefficient $K_C$. Then the value $\Phi \cdot N_p \cdot L_G \cdot K_C$ is preferably not less than 1.1 and not greater than 8.2 and the compensation coefficient $K_C$ is preferably not less than 0.005 and not greater than 0.1. The light guide plate 18, containing scattering particles satisfying the above relation, is capable of emitting uniform illuminating light through the light exit plane 18a with a greatly reduced level of brightness unevenness.

When parallel rays of light are caused to enter in an isotropic medium, a transmittance T is generally expressed according to the Lambert-Beer law by the following expression (1):

$$T = I/I_o = \exp(-\rho \cdot x) \quad (1)$$

where x is a distance, $I_o$ an intensity of incident light, I an intensity of outgoing light, and ρ an attenuation constant.

The above attenuation constant ρ can be expressed using the scattering cross section of particles Φ and the number of particles $N_p$ in unit volume contained in the medium as follows:

$$\rho = \Phi \cdot N_p \quad (2)$$

Accordingly, the light extraction efficiency $E_{out}$ is expressed by the following expression (3) where $L_G$ is the length of the light guide plate in the direction parallel to the direction in which light travels in the light guide plate from the light entrance planes of the light guide plate as far as the thickest position or a half of the length of the light guide plate in the direction of the optical axis. The half of the length of the light guide plate in the direction of the optical axis denoted by $L_G$ is the length of the light guide plate 18 in the direction perpendicular to the light entrance planes of the light guide plate 18 from one of the light entrance planes of the light guide plate 18 to the center of the light guide plate 18.

The light extraction efficiency $E_{out}$ is a ratio of light reaching the position spaced apart from the light entrance plane of the light guide plate by the length $L_G$ in the direction of the optical axis to the incident light. In the case of the light guide plate 18 illustrated in FIG. 2, for example, the light extraction efficiency $E_{out}$ is a ratio of light reaching the center of the light guide plate or, light traveling half the length of the light guide plate in the direction of the optical axis to the light incident on either end plane.

$$E_{out} \propto \exp(-\Phi \cdot N_p \cdot L_G) \quad (3)$$

The expression (3) applies to a space of limited dimensions. Introducing the compensation coefficient $K_C$ therein to correct the relation with the expression (1), the light extraction efficiency $E_{out}$ is expressed by the following expression (4). The compensation coefficient $K_C$ is a dimensionless compensation coefficient empirically obtained where light propagates through an optical medium of limited dimensions.

$$E_{out} = \exp(-\Phi \cdot N_p \cdot L_G \cdot K_C) \quad (4)$$

According to the expression (4), when $\Phi \cdot N_p \cdot L_G \cdot K_C$ is 3.5, the light extraction efficiency $E_{out}$ is 3%. When $\Phi \cdot N_p \cdot L_G \cdot K_C$ is 4.7, the light extraction efficiency $E_{out}$ is 1%.

A computer simulation was conducted to obtain light use efficiencies for different light guide plates given different values of $\Phi \cdot N_p \cdot L_G \cdot K_C$ by varying the scattering cross section $\Phi$, the particle density $N_p$, the length $L_G$, which is a half of the length of the light guide plate in the direction of the optical axis, and the compensation coefficient $K_C$. Further, illuminance unevenness was evaluated. The illuminance unevenness (%) was defined as $[(I_{Max}-I_{Min})/I_{Ave}] \times 100$, where $I_{Max}$ was a maximum illuminance of light emitted through the light exit plane of the light guide plate, $I_{Min}$ a minimum illuminance, and $I_{Ave}$ an average illuminance.

The measurement results are shown in Table 1. In Table 1, judgments "O" indicate cases where the light use efficiency is 50% or more and the illuminance unevenness is 150% or less whereas judgments "X" indicate cases where the light use efficiency is less than 50% or the illuminance unevenness is more than 150%.

TABLE 1

| | $\Phi$ [m$^2$] | $N_p$ [pcs/m$^3$] | $L_G$ [m] | $K_C$ | $\Phi \cdot N_p \cdot L_G \cdot K_C$ | Light use efficiency [%] | Illuminance unevenness [%] | Judgment |
|---|---|---|---|---|---|---|---|---|
| Example 1 | $2.0 \times 10^{-12}$ | $2.2 \times 10^{14}$ | 0.3 | 0.03 | 3.51 | 81.6 | 84 | O |
| Example 2 | $2.0 \times 10^{-12}$ | $4.3 \times 10^{14}$ | 0.3 | 0.02 | 6.21 | 84.7 | 149 | O |
| Example 3 | $2.0 \times 10^{-12}$ | $8.6 \times 10^{14}$ | 0.1 | 0.02 | 3.86 | 82.8 | 82 | O |
| Example 4 | $1.1 \times 10^{-10}$ | $1.5 \times 10^{13}$ | 0.3 | 0.008 | 3.91 | 83.0 | 105 | O |
| Example 5 | $1.1 \times 10^{-10}$ | $2.0 \times 10^{13}$ | 0.3 | 0.007 | 4.98 | 84.3 | 142 | O |
| Example 6 | $1.1 \times 10^{-10}$ | $3.5 \times 10^{13}$ | 0.1 | 0.007 | 2.86 | 79.2 | 47 | O |
| Comparative example 1 | $2.0 \times 10^{-12}$ | $2.2 \times 10^{13}$ | 0.3 | 0.05 | 0.66 | 29.1 | 51 | X |
| Comparative example 2 | $1.1 \times 10^{-12}$ | $2.5 \times 10^{12}$ | 0.3 | 0.01 | 0.99 | 43.4 | 59 | X |
| Comparative example 3 | $4.8 \times 10^{-18}$ | $8.6 \times 10^{17}$ | 0.1 | 15.2 | 6.26 | 84.8 | 201 | X |
| Comparative example 4 | $4.8 \times 10^{-18}$ | $1.7 \times 10^{18}$ | 0.1 | 13.9 | 11.5 | 84.9 | 225 | X |

The results show that the light extraction efficiency $E_{out}$ decreases as $\Phi \cdot N_p \cdot L_G \cdot K_C$ increases. The light extraction efficiency $E_{out}$ decreases in such a manner presumably because light is scattered increasingly as it travels in the direction of the optical axis of the light guide plate.

It therefore follows that the greater the value $\Phi \cdot N_p \cdot L_G \cdot K_C$ is, the more preferable the property of the light guide plate is. When $\Phi \cdot N_p \cdot L_G \cdot K_C$ is great, light exiting through a plane opposite the light entrance plane can be reduced whereas light emitted through the light exit plane can be increased. Expressed otherwise, when $\Phi \cdot N_p \cdot L_G \cdot K_C$ is great, the ratio of light emitted through the light exit plane to light incident on the light entrance planes can be increased. That ratio is also referred to as "light use efficiency" below. Specifically, the light use efficiency can be increased to 50% or more when $\Phi \cdot N_p \cdot L_G \cdot K_C$ is 1.1 or greater.

While light emitted through the light exit plane 18a of the light guide plate 18 increasingly exhibits illuminance unevenness as $\Phi \cdot N_p \cdot L_G \cdot K_C$ increases, the illuminance unevenness can be held to under a given, tolerable level by holding the value $\Phi \cdot N_p \cdot L_G \cdot K_C$ to 8.2 or less. Note that illuminance and brightness can be treated substantially equally. Thus, it is assumed that brightness and illuminance possess similar tendencies in the present invention.

Thus, the value $\Phi \cdot N_p \cdot L_G \cdot K_C$ of the inventive light guide plate 18 is preferably not less than 1.1 and not greater than 8.2, and more preferably not less than 2.0 and not greater than 8.0. Still more preferably, the value $\Phi \cdot N_p \cdot L_G \cdot K_C$ is not less than 3.0 and, most preferably, not less than 4.7.

The compensation coefficient $K_C$ is preferably not less than 0.005 and not greater than 0.1, thus $0.005 \leq K_C \leq 0.1$.

Now, the light guide plate 18 will be described in greater detail by referring to specific examples.

Figure 5:
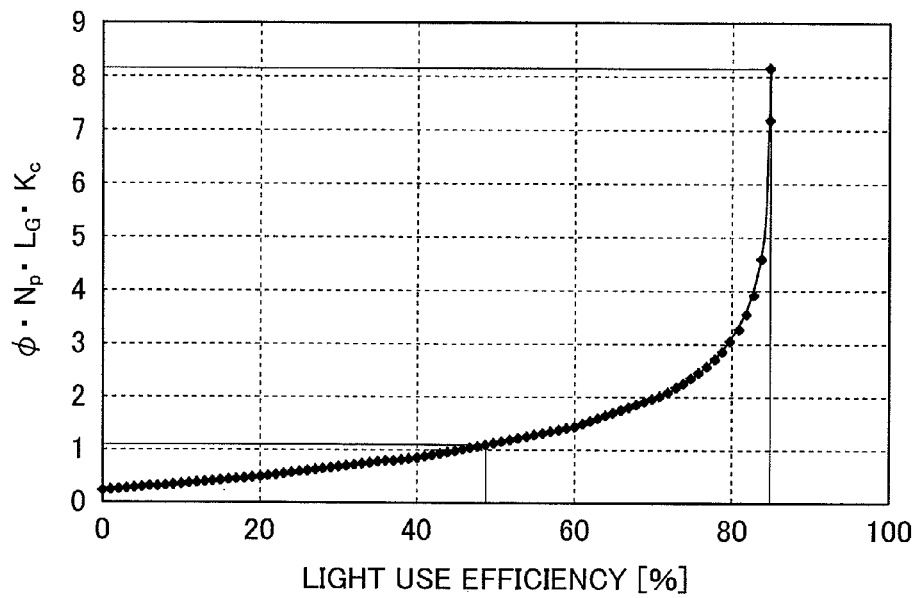
FIG. 5 is a graph illustrating measurements of a relationship between $\Phi \cdot N_p \cdot L_G \cdot K_C$ and light use efficiency.

FIG. 5 illustrates a relation between $\Phi \cdot N_p \cdot L_G \cdot K_C$ and light use efficiency, i.e., the ratio of light emitted through the light exit plane 18a to light incident on the light entrance planes.

Table 1 and FIG. 5 show that given $\Phi \cdot N_p \cdot L_G \cdot K_C$ of 1.1 or more, a high light use efficiency, specifically 50% or more, is achieved whereas given $\Phi \cdot N_p \cdot L_G \cdot K_C$ of 8.2 or less, illuminance unevenness can be held to 150% or less.

It is also shown that given $K_C$ of 0.005 or more, a high light use efficiency is achieved, and given $K_C$ of 0.1 or less, illuminance unevenness observed in light emitted from the light guide plate can be reduced to a low level.

Next, light guide plates varying in particle density $N_p$ of the particles kneaded or dispersed therein were fabricated to measure brightness distributions of light emitted at different positions in the individual light guide plates. In these examples, the conditions including scattering cross section $\Phi$, length $L_G$, which is a half of the length of the light guide plate in the direction of its optical axis, compensation coefficient $K_C$, and shape of the light guide plate, but excluding particle density $N_p$, were respectively set to fixed values as the measurements were made. In the embodiment under discussion, therefore, the value $\Phi \cdot N_p \cdot L_G \cdot K_C$ changes in proportion as the particle density $N_p$ changes.

Figure 6:
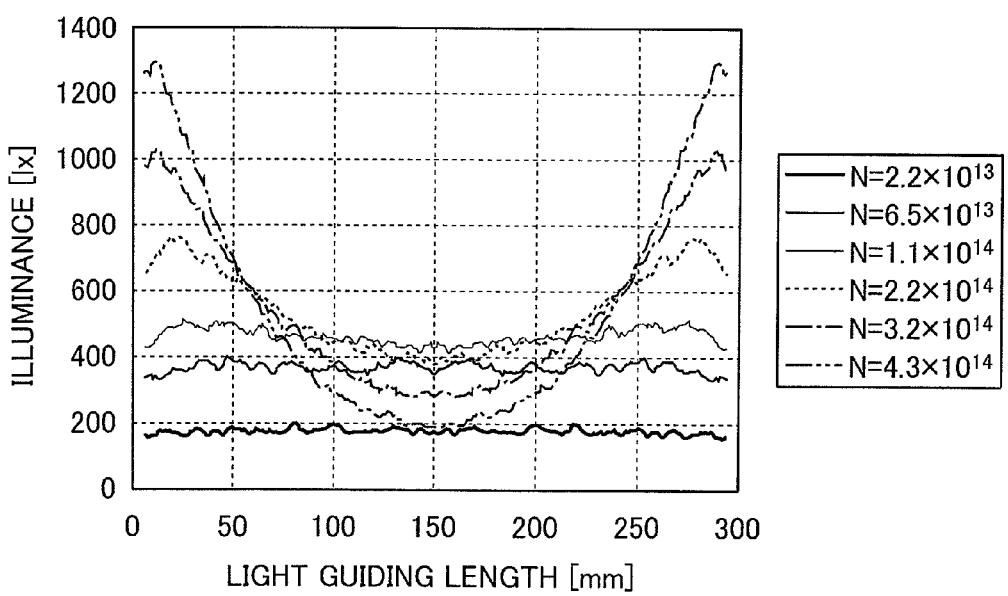
FIG. 6 is a graph illustrating measurements of illuminance of light emitted from different light guide plates having different particle densities.

FIG. 6 shows the measurements of the distribution of illuminance observed in the light emitted through the light exit plane of the individual light guide plates having different particle densities. FIG. 6 shows the illuminance [lx] on the vertical axis plotted against a light guiding length or the distance [mm] from one of the light entrance planes of the light guide plate on the horizontal axis.

Illuminance unevenness was calculated from $[(I_{Max}-I_{Min})/I_{Ave}] \times 100$ [%], where $I_{Max}$ is a maximum illuminance in the measured distribution of light emitted from areas close to lateral ends of the light exit plane, $I_{Min}$ is a minimum illuminance, and $I_{Ave}$ is an average illuminance.

Figure 7:
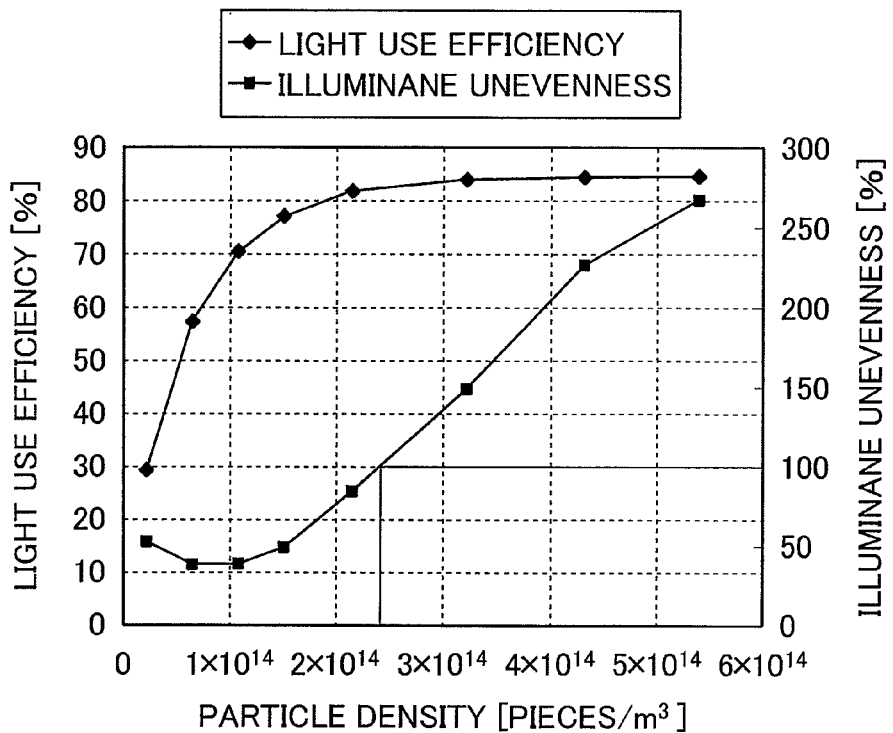
FIG. 7 is a graph illustrating a relationship between light use efficiency and illuminance unevenness on the one hand and particle density on the other.

FIG. 7 illustrates the relation between the calculated illuminance unevenness and particle density. FIG. 7 shows the illuminance unevenness [%] on the vertical axis plotted against the particle density [pieces/m³] on the horizontal axis. Also shown in FIG. 7 is the relation between light use efficiency and particle density, the particle density being likewise indicated on the horizontal axis and the light use efficiency [%] on the vertical axis.

As shown in FIGS. 6 and 7, increasing the particle density or, consequently, increasing $\Phi \cdot N_p \cdot L_G \cdot K_C$, results in an enhanced light use efficiency but then illuminance unevenness also increases. The graphs also show that reducing the particle density or, consequently, reducing $\Phi \cdot N_p \cdot L_G \cdot K_C$, results in lowered light use efficiency but then illuminance unevenness decreases.

$\Phi \cdot N_p \cdot L_G \cdot K_C$ of not less than 1.1 and not greater than 8.2 yields a light use efficiency of 50% or more and illuminance unevenness of 150% or less. Illuminance unevenness, reduced to 150% or less, is inconspicuous.

Thus, it will be understood that $\Phi \cdot N_p \cdot L_G \cdot K_C$ of not less than 1.1 and not greater than 8.2 yields light use efficiency greater than a certain level and a reduced illuminance unevenness.

The shape of the light guide plate is not limited to the above shapes and may be any shape, provided that the light guide plate grows thicker with the increasing distance from the light entrance planes.

For example, prism arrays may be provided on the first inclined plane 18b and the second inclined plane 18c in the direction parallel to the first light entrance plane 18d and the second light entrance plane 18e. Instead of the prism arrays, optical elements similar to prisms may be formed and arranged regularly. For example, elements having lens effects such as lenticular lenses, concave lenses, convex lenses, or optical elements in pyramidal shape may be formed on the inclined planes of the light guide plate.

The shape of the light guide plate is not limited to the shape of the embodiment under discussion. For example, the light guide plate may have a shape obtained by cutting the light guide plate illustrated in FIG. 2 in half, i.e., a shape having only one light entrance plane and growing thicker with the increasing distance from the light entrance plane. According to this alternative, the light entrance plane is constituted by one light entrance plane formed on one side of the light exit plane, whereas the inclined plane is constituted by one inclined plane so inclined as to be farther from the light exit plane from the light entrance plane toward the opposite end face such that the light guide plate is thinnest at the light entrance plane and thickest at the opposite end face. In another alternative, the four lateral sides of the light guide plate may all be light entrance planes, with light sources provided adjacent the four sides of the light guide plate, and the thickness of the light guide plate increases from the four light entrance planes toward the center of the light guide plate, thus representing a shape of a quadrangular pyramid on the side opposite from the light exit plane; expressed otherwise, the light entrance plane for this light guide plate is constituted by four light entrance planes formed on the four sides of the light exit plane whereas the inclined plane for this light guide plate is constituted by four inclined planes inclined in such a manner as to be farther from the light exit plane with the increasing distance from the four light entrance planes toward the center such that the light guide plate is thinnest at the light entrance planes and thickest in the position where the four inclined planes meet.

The light guide plate given such a shape is also capable of allowing light to travel far from the light entrance plane, while keeping a thin design. Thus, the light guide plate can be provided with a reduced thickness and a larger light exit plane.

Also with the light guide plate having the above shape, the value $\Phi \cdot N_p \cdot L_G \cdot K_C$ is preferably in the range of not less than 1.1 and not greater than 8.2 where $L_G$ is the length in the incident direction from the light entrance plane to the position where the thickness of the light guide plate in the direction perpendicular to the light exit plane is thickest. When $\Phi \cdot N_p \cdot L_G \cdot K_C$ satisfies the above range, light with a reduced illuminance unevenness and a high light use efficiency can be emitted through the light exit plane.

Next, the prism sheet 20 will be described.

As illustrated in FIG. 2, one prism sheet 20 is provided between the light guide plate 18 and a diffusion film 22. Thus, the prism sheet 20 is disposed opposite the light exit plane 18a of the light guide plate 18. The prism sheet 20 is an optical member formed by arranging elongate prisms parallel to each other on a transparent sheet. The prism sheet 20 helps condense light emitted through the light exit plane 18a of the light guide plate 18 and thus improves the brightness. The prism sheet 20 is disposed such that the vertexes of the prisms face the light exit plane 18a of the light guide plate 18, or face downward in FIG. 2. Alternatively, a second prism sheet having an identical structure may be placed on the prism sheet 20 such that the prisms of the additional prism sheet cross the prisms of the prism sheet 20. Alternatively, the prism sheet may have a configuration such that numerous prisms each with a shape of a triangular pyramid or a quadrangular pyramid are arranged on the surface of a transparent sheet.

Next, the diffusion film 22 will be described.

The diffusion film 22 is provided on the side of the prism sheet 20 opposite from the light guide plate 18. Thus, on the light exit plane 18a of the light guide plate 18 are superposed the prism sheet 20 and the diffusion film 22 in this order from the light exit plane 18a.

The diffusion film 22 is formed of a material in the form of film given a light diffusing property. The material in the form of film may be formed, for example, of an optically transparent resin such as PET (polyethylene terephthalate), PP (polypropylene), PC (polycarbonate), PMMA (polymethyl methacrylate), benzyl methacrylate, MS resin, or COP (cycloolefin polymer).

The method of forming the diffusion film 22 is not limited specifically. For example, a surface of the material in the form of film may be machined to form an asperity thereon or roughened by grinding thereby to provide a light diffusing property. The diffusion film may be alternatively formed by coating its surface with a material that diffuses light as exemplified by silica; pigments such as titanium oxide and zinc oxide; a resin; and beads of glass, zirconia, etc., together with a binder, or by kneading the above pigments or beads having a light diffusing property into the above transparent resin. Materials having a high reflectance and a low light-absorbing property such as metals as exemplified by Ag and Al may also be used to form the diffusion film 22.

In the present invention, a diffusion film of a matte type or a coating type may be used as the diffusion film 22.

While the diffusion film 22 is placed on the prism sheet 20 in the example illustrated in FIG. 2, the position of the diffusion film 22 is not limited specifically; it may also be placed between the light guide plate 18 and the prism sheet 20.

Next, the reflection plate 24 of the main body of the lighting device will be described.

The reflection plate 24 is provided to reflect light leaking through the first inclined plane 18b and the second inclined plane 18c of the light guide plate 18 back into the light guide plate 18 and helps enhance the light use efficiency. The reflection plate 24 is shaped according to the contour of the first inclined plane 18b and the second inclined plane 18c of the light guide plate 18 to cover the first inclined plane 18b and the second inclined plane 18c.

In the embodiment under discussion, the reflection plate 24 is shaped to contour the triangular shape formed by the first inclined plane 18b and the second inclined plane 18c as illustrated in FIG. 2.

The reflection plate 24 may be formed of any material as desired, provided that it is capable of reflecting light leaking through the inclined planes of the light guide plate 18. The reflection plate 24 may be formed, for example, of a resin sheet produced by kneading, for example, PET or PP (polypropylene) with a filler and then drawing the resultant mixture to form voids therein to increase the reflectance; a sheet with a specular surface formed by, for example, depositing aluminum vapor on the surface of a transparent resin sheet or a white resin sheet; a metal foil such as an aluminum foil or a resin sheet carrying a metal foil; or a thin sheet metal having a sufficient reflective property on the surface.

The upper light guide reflection plates 34 are disposed between the light guide plate 18 and the prism sheet 20, i.e., on the side of the light guide plate 18 closer to the light exit plane 18a, covering the light sources 12 and the end portions of the light exit plane 18a, i.e., the end portion thereof closer to the first light entrance plane 18d and the end portion thereof closer to the second light entrance plane 18e. Thus, the upper light guide reflection plates 34 are disposed to cover an area extending from part of the light exit plane 18a of the light guide plate 18 as far as part of the array bases 42 of the light sources 12 in a direction parallel to the direction of the optical axis. Briefly, two upper light guide reflection plates 34 are disposed on both end portions of the light guide plate 18.

The lower light guide reflection plates 36 are disposed on the side of the light guide plate 18 opposite from the light exit plane 18a, i.e., on the same side as the first inclined plane 18b and the second inclined plane 18c, covering part of the light sources 12. The ends of the lower light guide reflection plates 36 closer to the center of the light guide plate 18 are connected to the reflection plate 24.

The upper light guide reflection plates 34 and the lower light guide reflection plates 36 may be formed of any of the above-mentioned materials used to form the reflection plate 24.

The upper light guide reflection plates 34 thus provided prevents light emitted from the light sources 12 from leaking onto the side closer to the light exit plane 18a instead of entering the light guide plate 18.

Thus, light emitted from the LED chips 40 of the light sources 12 is efficiently admitted through the first light entrance plane 18d and the second light entrance plane 18e of the light guide plate 18, increasing the light use efficiency.

The lower light guide reflection plates 36 also prevents light emitted from the light sources 12 from leaking onto the side closer to the first inclined plane 18b and the second inclined plane 18c of the light guide plate 18 instead of entering the light guide plate 18.

Accordingly, light emitted by the LED chips 40 of the light sources 12 is efficiently admitted through the first light entrance plane 18d and the second light entrance plane 18e of the light guide plate 18, increasing the light use efficiency.

The shapes and the widths of the upper light guide reflection plates 34 and the lower light guide reflection plates 36 are not limited specifically, provided that light emitted by the light sources 12 is reflected and directed toward the first light entrance plane 18d or the second light entrance plane 18e such that light emitted by the light sources 12 can be admitted through the first light entrance plane 18d or the second light entrance plane 18e and then guided toward the center of the light guide plate 18.

Now, the housing 16 will be described.

The housing 16 is provided to accommodate and support the light sources 12 and the main body 14 of the lighting device and basically comprises the housing member 16a and the frame member 16b.

The housing member 16a is open on the upper side and has a configuration such that the main body 14 of the lighting device is placed in the housing member 16a from above to be accommodated and supported therein such that the housing member 16a covers the four lateral faces of the main body 14 of the lighting device. The four lateral faces are each formed into turnup members 26 each having an inverted U shape.

The frame member 16b has a rectangular opening 28 on the upper side thereof smaller than the rectangular light exit plane 14a of the main body 14 of the lighting device. The frame member 16b is placed from above the light exit plane 14a of the main body 14 of the lighting device and secured to the housing member 16a so as to cover the main body 14 of the lighting device and the housing member 16a accommodating the main body 14 of the lighting device including the four lateral faces of the housing member 16a.

The inner faces of the turnup members 26 engage and support the lateral faces of the light guide plate 18, the reflection plate 24 and the light guide plate support members 30 to be described. Further, the outer faces of the turnup members 26 engage the frame member 16b.

The turnup members 26 of the housing member 16a and the frame member 16b may be connected by any known method such as a method using bolts and nuts, a method using bonds, or a method using welding. The housing 16 is configured basically as described above.

The inventive planar lighting device 10 further comprises the light guide plate support members 30 between the housing member 16a and the reflection plate 24. The light guide plate support members 30, formed of a resin such as polycarbonate, are in contact with the housing member 16a and the reflection plate 24.

The housing member 16a is provided on its bottom side with a power supply holder 32 illustrated in FIG. 1 to house a power supply unit, not shown, for the light sources 12.

Now, the fluorescent member 17 will be described.

Figure 8A:
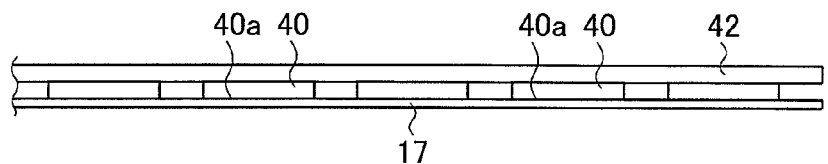
FIGS. 8A, 8B, and 8C illustrate part of a fluorescent member and a light source of the planar lighting device of FIG. 2.
Figure 8B:
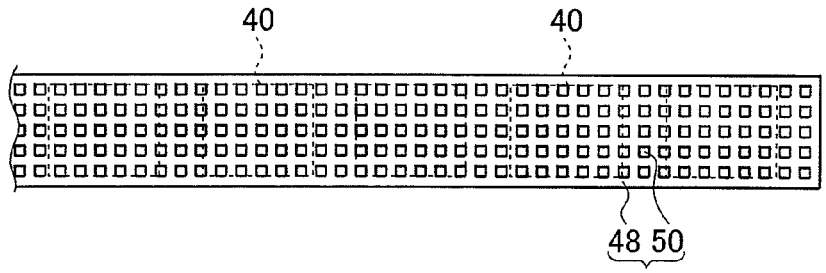
Figure 8C:
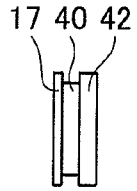

FIGS. 8A to 8C illustrate part of the fluorescent member and the light source of the planar lighting device of FIG. 2. FIG. 8A is a top plan view, FIG. 8B is a front view, and FIG. 8C is an elevation.

As illustrated in FIGS. 8A to 8C, the fluorescent member 17 is a sheet member disposed on and in contact with the light emission faces 40a of the LED chips 40 of the light sources 12. More specifically, the fluorescent member 17 is in contact with the light emission faces 40a of the LED chips 40 of the light source 12 where the fluorescent member 17 is located opposite the light emission faces 40a. The fluorescent member 17 may be mounted by any method. For example, it may be bonded to the light emission faces 40a with a bonding material, or secured to the light emission faces 40a with, for example, fixing members such that the fluorescent member 17 is in contact with the light emission faces 40a.

The fluorescent member 17 is a sheet member having dimensions sufficient to lie over the light emission faces 40a of all the LED chips 40 disposed on the array base 42. The fluorescent member 17 comprises a fluorescent substance coated area 48 and apertures 50. Expressed otherwise, the fluorescent member 17 is basically formed with the fluorescent substance coated area 48 having rectangular apertures 50 formed therein at given intervals. Thus, the other part of the fluorescent member 17 than the apertures 50 is the fluorescent substance coated area 48 formed of a fluorescent substance.

The fluorescent substance coated area 48 is formed of a YAG (yttrium aluminum garnet) base fluorescent substance. When blue light emitted by the LED chips 40 passes through the fluorescent substance coated area 48, the YAG base fluorescent substance generates fluorescence.

Thus, when blue light emitted by the LED chips 40 passes through the fluorescent substance coated area 48, the blue light emitted by the LED chips 40 and the light radiated as the YAG base fluorescent substance generates fluorescence blend to produce white light. Thus, the light emitted by the LED chips 40 and transmitted through the fluorescent substance coated area 48 converts from blue light into white light. Expressed otherwise, the fluorescent substance coated area 48 converts blue light that it transmits into white light.

The apertures 50 are rectangular apertures formed, as described above, in the fluorescent member 17 in the form of sheet at regular intervals in matrix form. The apertures 50 pass blue color emitted by the LED chips 40 as blue color. Thus, light emitted by the LED chips 40 and passed through the apertures 50 come out unchanged therethrough as blue light.

Thus, the fluorescent member 17 comprises two regions: one region provided by the fluorescent substance coated area 48 to convert blue light into white light and the other region provided by the apertures 50 to transmit blue light as blue light.

The fluorescent member 17 comprising the fluorescent substance coated area 48 and the apertures 50 may be fabricated, for example, by applying a fluorescent substance onto the whole area of a transparent sheet to form the fluorescent substance coated area over the whole area of the transparent sheet, and then cutting out apertures.

By another method, the apertures may be first cut out from a transparent sheet, thereafter applying a fluorescent substance onto the transparent sheet to form the fluorescent substance coated area.

The planar lighting device 10 is configured basically as described above.

Thus, in the planar lighting device 10, where the fluorescent members 17 are provided for the light emission faces 40a of the LED chips 40 that emit blue light, light emitted by the individual LED chips 40 passes through the fluorescent members 17, enters the first light entrance plane 18d or the second light entrance plane 18e of the light guide plate 18, and exits through the light exit plane 18a. Light emitted through the light exit plane 18a passes through or is transmitted through the prism sheet 20, the diffusion film 22, and other optical members before it is emitted through the light exit plane 14a.

Thus, the planar lighting device 10 is capable of emitting light having a high color temperature through the light exit plane of the light guide plate or the planar lighting device by providing apertures 50 in part of the fluorescent members 17 formed of the fluorescent substance coated area 48 that converts blue light into white light so that part of the blue light emitted through the light emission faces 40a of the LED chips 40 is emitted as blue light. More specifically, the fluorescent member disposed between the light entrance planes of the light guide plate, i.e., the first light entrance plane and the second light entrance plane, on the one hand and the light emission faces of the LEDs on the other, has apertures partly formed therein to allow the light emitted by the LEDs passing through the partly formed apertures to pass unchanged as blue light and convert the light passing through the fluorescent substance coated area into white light, thereby achieving emission of light having a high color temperature through the light exit plane. Blue light and white light, after they are transmitted through the fluorescent member, are mixed as they pass through the light guide plate.

The ratio of white light and blue light obtained through the fluorescent member 17 can be easily adjusted by varying the ratio of the apertures 50 formed in the fluorescent member 17. The color temperature can therefore be adjusted easily. Thus, light having a desired color temperature can be emitted through the light exit plane of the light guide plate or the planar lighting device with a simple adjustment. Such adjustment of color temperature is easier than controlling the color temperature by adjusting the thickness of the fluorescent substance coated on the fluorescent member.

The fluorescent member 17 is preferably so formed as to satisfy $0.05 \leqq Sap/Sa \leqq 0.40$, where Sa is the whole area of the fluorescent member 17 and Sap is the sum of the areas of the apertures 50, i.e., the sum of the blue light passing areas.

When Sap/Sa is 0.05 or greater, a color temperature of 7000 K or higher is obtained and when Sap/Sa is 0.40 or less, a color temperature of 35000 K or lower is obtained.

Now description will be made in greater detail referring to some specific examples.

In the specific example now to be described below, the brightness distribution and the color temperature of light emitted through the light exit plane 14a of the planar lighting device 10 were measured, varying the ratio of the sum Sap of the blue light passing areas to the whole area Sa of the fluorescent member 17.

Figure 9:
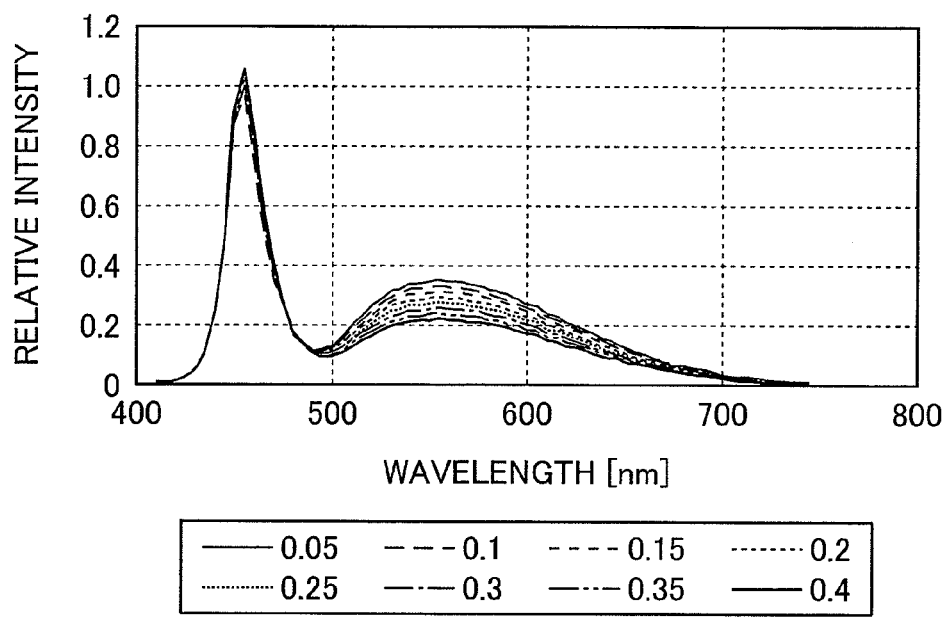
FIG. 9 is a graph illustrating measurements of wavelength distributions observed in light emitted through the light exit plane of the inventive planar lighting device as Sap/Sa was varied.

FIG. 9 is a graph illustrating the measurements of waveform distribution or spectra of light emitted through the light exit plane of the planar lighting device as the ratio of the sum Sap of the blue light passing areas to the whole area Sa of the fluorescent member 17, i.e., Sap/Sa, was varied among 0.05, 0.1, 0.15, 0.2, 0.25, 0.3, 0.35 and 0.4. In FIG. 9, the vertical axis indicates the relative intensity and the horizontal axis indicates the wavelength [nm].

Figure 10:
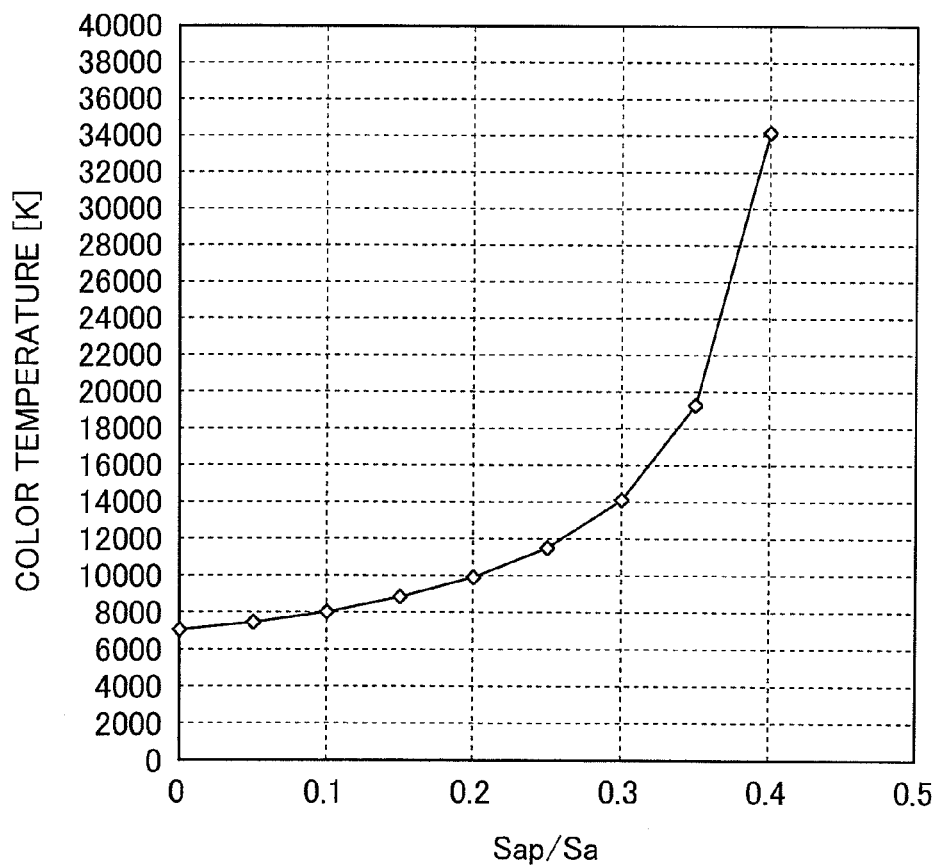
FIG. 10 is a graph illustrating a relationship between the ratio of the sum Sap of the areas of blue light passing areas to the whole area Sa of the fluorescent member on the one hand and the color temperature of light emitted through the light exit plane on the other.

FIG. 10 is a graph illustrating a relationship between the ratio Sap/Sa of the sum Sap of the blue light passing areas to the whole area Sa of the fluorescent member 17 on the one hand and the color temperature of the light emitted through the light exit plane on the other. In FIG. 10, the vertical axis indicates the color temperature [K] and the horizontal axis indicates the ratio Sap/Sa of the sum Sap of the blue light passing areas to the whole area Sa of the fluorescent member 17.

FIG. 10 shows that the color temperature of light emitted through the light exit plane can be raised by providing the apertures.

FIG. 10 further shows that various color temperatures can be obtained by changing Sap/Sa. According to the embodiment under discussion, any color temperature in a range of about 7000 K inclusive to 34000 K inclusive can be obtained by adjusting the ratio of the sum of the areas of the apertures to the whole area of the fluorescent member within a range of $0.05 \leqq Sap/Sa \leqq 0.40$. This means that the color temperature can be adjusted merely by adjusting the dimensions of the apertures.

FIG. 9 also shows that the color tint of the light emitted through the light exit plane can be adjusted by adjusting the ratio of the areas of the apertures to the whole area of the fluorescent member.

The effects of the present invention will be clear from the above description.

While the apertures 50 of the fluorescent member 17 of the embodiment under discussion are rectangular, the apertures 50 may have other various shapes as well.

Figure 11A:
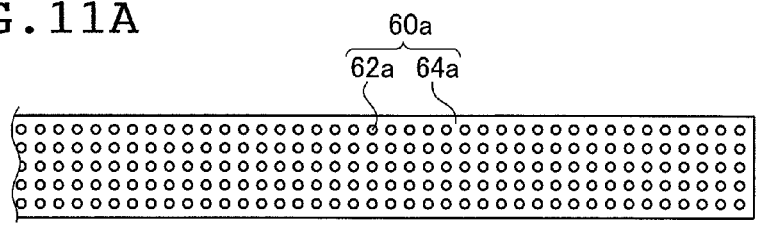
FIGS. 11A to 11C are front views illustrating other examples of the fluorescent member.
Figure 11B:
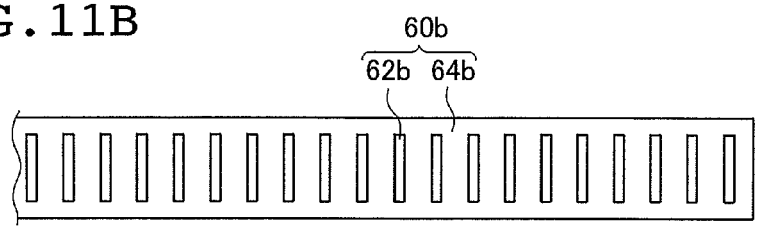
Figure 11C:
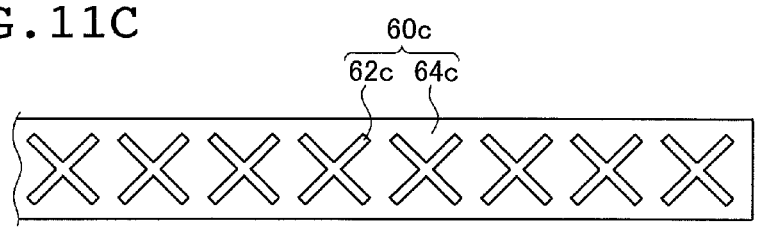

FIGS. 11A to 11C illustrate other examples of the fluorescent member.

For example, circular apertures 62a may be formed in a fluorescent member 60a, the other part of the fluorescent member 60a than the apertures 62a being a fluorescent substance coated area 64a, as illustrated in FIG. 11A. The apertures need not necessarily be circular and may be, for example, elliptical, polygonal, or shaped like a star.

Alternatively, bar-shaped apertures 62b may be formed in a fluorescent member 60b so as to be parallel to one side of the light emission face and provided at regular intervals, the other part of the fluorescent member 60b than the apertures 64b being a fluorescent substance coated area 64b, as illustrated in FIG. 11B.

In yet another example, X-shaped apertures 62c may be formed in a fluorescent member 60c, the other part of the fluorescent member 60c than the apertures 62c being a fluorescent substance coated area 64c, as illustrated in FIG. 11C.

Thus, while the shape of the apertures is not limited specifically, a plurality of apertures are preferably provided for the light emission face of each LED chip. Providing a plurality of apertures for the light emission face of each LED chip makes it easier to blend blue light and white light produced as light emitted by the LED chip is transmitted through the fluorescent member. Thus, light free from uneven coloration or with reduced level of uneven coloration and with a high color temperature can be emitted through the light exit plane.

Each aperture preferably has an area measuring not smaller than 0.1 mm$^2$ and not greater than 0.5 mm$^2$. Apertures each having an area measuring not smaller than 0.1 mm$^2$ ensure unfailing formation of apertures in the fluorescent member and emission of blue light through the apertures. Apertures each having an area measuring not greater than 0.5 mm$^2$ ensures that light transmitted through the fluorescent member is blended efficiently and unfailingly and that light free from uneven coloration or with reduced level of uneven coloration and with a high color temperature can be emitted through the light exit plane.

While, according to the embodiment under discussion, apertures are formed in part of the fluorescent member to provide the blue light passing areas through which blue light is passed unchanged as blue light, the present invention is not limited to such configuration. The fluorescent substance may be selectively applied to the transparent sheet in such a manner as to form a fluorescent substance coated area coated with the fluorescent substance and transparent areas without coating of the fluorescent substance, the transparent areas providing the blue light passing areas for passing blue light unchanged as blue light.

While, according to the embodiment described above, the fluorescent member is provided in contact with the light emission faces 40a of the LED chips 40 of the light sources 12, the present invention is not limited to such configuration. The fluorescent member may be located in any position desired between the light emission faces of the LEDs and the light entrance planes, i.e., the first light entrance plane and the second light entrance plane, of the light guide plate.

Figure 12:
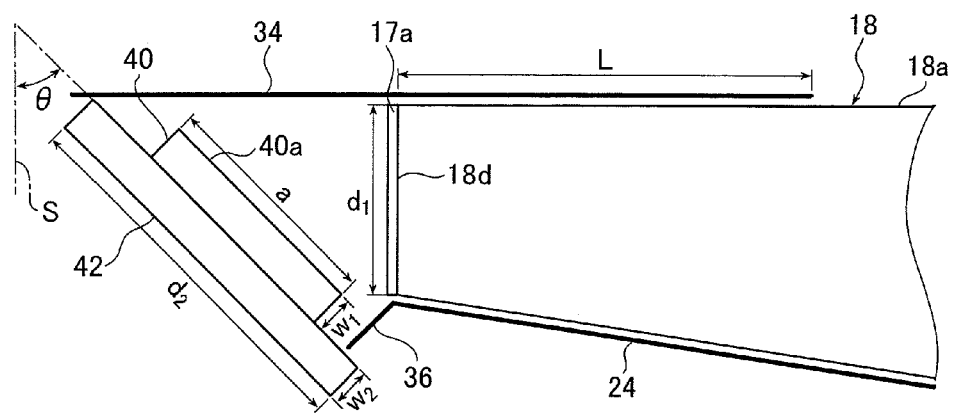
FIG. 12 is a sectional view schematically illustrating a configuration of another embodiment of the inventive planar lighting device.

FIG. 12 is an enlarged sectional view illustrating another embodiment of the inventive planar lighting device.

Since the planar lighting device according to the embodiment under discussion is symmetrical with respect to the bisector earlier described, FIG. 12 only illustrates one side of the light guide plate, i.e., the side on which the first light entrance plane 18d is located, omitting the other side, i.e., the side on which the second light entrance plane 18e is located. The side on which the second light entrance plane 18e is located has substantially the same configuration. The same applies to the other examples of the planar lighting device to be described.

As illustrated in FIG. 12, a fluorescent member 17a may be provided in contact with the first light entrance plane 18d of the light guide plate 18. The fluorescent member 17a preferably has a larger area than or the same area as the first light entrance plane 18d. The fluorescent member 17a having an area equal to or larger than the first light entrance plane 18d prevents light emitted by the LED chips 40 from entering the first light entrance plane 18d of the light guide plate 18 without passing through the fluorescent member 17a.

Where the fluorescent member 17a is provided on the first light entrance plane 18d of the light guide plate 18 as described above, the fluorescent member 17a may be provided by directly applying the fluorescent substance to the first light entrance plane 18d of the light guide plate 18 to form the fluorescent substance coated area and the apertures without using the transparent sheet.

While, according to the embodiment described above, the fluorescent member 17a is disposed as attached to the light guide plate or the light source in any of the examples given, the fluorescent member 17a may be provided as a discrete sheet member between the light entrance plane and the light emission faces.

While, according to the embodiment described above, the fluorescent member 17a is provided in the form of one sheet, the present invention is not limited to such configuration. An individual, separate piece of fluorescent member may be provided for the light emission face of each LED chip.

FIGS. 13A to 13C illustrate part of the fluorescent members and the light source of another example of the planar lighting device: FIG. 13A is a top plan view, FIG. 13B is a front view, and FIG. 13C is an elevation.

Each fluorescent member 70 illustrated in FIGS. 13A to 13C is provided separately for each LED chip 40, in contact with the light emission face 40a of each LED chip 40. In the embodiment under discussion, each fluorescent member 70 is bonded to the corresponding light emission face 40a.

The fluorescent member 70 comprises a fluorescent substance coated area 72 and apertures 74 and is so provided as to cover the whole light emission face 40a of the LED chip 40. The fluorescent member 70 comprises the fluorescent substance coated area 72 formed of applied fluorescent substance and the apertures 74, or circular apertures having a given diameter provided at regular intervals. Thus, the fluorescent member 70, like the foregoing examples, also comprises the fluorescent substance coated area 72, which is an area through which blue color emitted by the LED chips 40 is converted into white light, and apertures, i.e., blue light passing areas, which provide areas through which blue light is passed unchanged as blue light.

When the fluorescent member 70 is so disposed as to cover the whole light emission face 40a of the LED chip 40, light emitted from the light emission face 40a is transmitted through or passes through the fluorescent substance coated area 72 or the apertures 74 of the fluorescent member 70 even with the configuration in which the fluorescent member 70 is separately provided for each LED chip 40 as described above.

Thus, as with the foregoing examples, part of light emitted from the LED chips 40 can be admitted into the light guide plate as blue light and light having a high color temperature can be emitted through the light exit plane with a simple configuration.

Where the fluorescent member is separately provided for each LED chip, the shape of the apertures is also not limited specifically. The apertures 74 may each be circular as illustrated in FIG. 13B, or apertures 78a formed in a fluorescent member 76 may be rectangular as illustrated in FIG. 14A.

While a plurality of apertures are preferably provided for the light emission face 40a of each LED chip 40 because the fluorescent member is then capable of efficiently blending the colors of emitted light and allows light free from uneven coloration to be emitted through the light exit plane, a single aperture 78b may be provided for each light emission face 40a, as illustrated in FIG. 14B. That is to say, one aperture 78b may be provided per one fluorescent member 76b. The shape of the apertures is also not specifically limited in this case: while FIG. 14B illustrates an example where the apertures 78b are rectangular, apertures 78c of a fluorescent member 76c are circular as illustrated in FIG. 14C. Other possible alternative shapes include an ellipse, a star-like shape, a polygon and a shape comparable to the letter X.

Where the fluorescent member 70 is provided in contact with the light emission face of the LED as in the embodiment under discussion, the fluorescent substance may be applied directly onto the light emission face to form the fluorescent substance coated area and the apertures.

This configuration not only prevents misalignment or dislocation of the fluorescent member 70 but also reduces the number of components required because the fluorescent member is formed without using the transparent sheet, thus simplifying the configuration of the device.

Now, referring to FIGS. 2 and 3, the LED chips 40 and the array bases 42 of the light sources 12 of the planar lighting device 10 according to the embodiment under discussion are tilted a given angle θ with respect to a plane S (hereinafter referred to also as "reference plane S") that is perpendicular to the light exit plane 18a of the light guide plate 18 and parallel to the longer sides of the first light entrance plane 18d or the second light entrance plane 18e. Specifically, the light emission faces 40a of the LED chips 40 are tilted by the angle θ with respect to the reference plane S. Expressed otherwise, the light emission faces 40a are disposed in a position reached by rotating the light emission faces 40a toward the light exit plane 18a by the angle θ from the reference plane S.

The light sources 12 thus tilted allow the light emitted by light sources having large-area light emission faces to be efficiently admitted into the light guide plate. Use of light sources having large-area light emission faces in turn enables an increased amount of light to be emitted by the light sources. Thus, high-brightness light can be emitted through the light exit plane of the light guide plate by efficiently admitting light emitted by the light sources having large-area light emission faces into the light guide plate.

Further, even where the light emission faces are tilted a given angle, the upper light guide reflection plates and the lower light guide reflection plates, which reflect light emitted by the light sources, prevent light emitted by the light sources from being emitted without entering the light guide plate and efficiently cause light emitted by the light sources to strike the first light entrance plane and the second light entrance plane of the light guide plate.

Each LED chip 40 of the light sources 12 is preferably shaped such that its length in the direction in which the light emission face 40a is tilted, which is, in the embodiment under discussion, the length "a" (see FIG. 4) of the light emission face 40a of the LED chips 40 perpendicular to the direction in which the LED chips 40 are arrayed, is longer than the length in cross section of the first light entrance plane 18d perpendicular to the light exit plane 18a, which is, in the embodiment under discussion, the length d1 of the first light entrance plane 18d or the second light entrance plane 18e of the light guide plate 18 in the direction perpendicular to the light exit plane 18a of the light guide plate 18 (the length d1 being hereinafter referred to as "length d1 of the light entrance plane in effective cross section"), or yet otherwise expressed, the length of the first light entrance plane 18d or the second light entrance plane 18e in the direction of the thickness of the light guide plate.

The light emission face 40a having the length "a" longer than the length d1 of the light entrance plane in effective cross section allows more light than otherwise to be emitted through the light emission face.

Further, also where the light emission face 40a has the length "a" longer than the length d1 of the light entrance plane in effective cross section, the light emission plane 40a disposed at the given angle θ with respect to the reference plane S causes light to enter the light guide plate efficiently and, as earlier described, high-brightness light to be efficiently emitted through the light exit plane of the light guide plate.

The inclination angle θ by which the light emission face 40a is tilted with respect to the reference plane S is preferably not less than 15° and not greater than 90°, thus $15° \leq θ \leq 90°$ and more preferably, not less than 15° and not greater than 75°, thus $15° \leq θ \leq 75°$. The inclination angle θ is the angle by which the light emission face 40a is tilted from the reference plane S toward the light exit plane 18a. When θ=90°, the light emission face 40a is parallel to the light exit plane 18a and, therefore, light is emitted through the light emission face 40a in the same direction in which light is emitted through the light exit plane 18a of the light guide plate 18.

The inclination angle θ of the light emission face 40a set anywhere in the range of $15° \leq θ \leq 90°$ enables a higher light use efficiency to be achieved while ensuring uniformity of the light emitted through the light exit plane. The inclination angle θ in the range of $15° \leq θ \leq 75°$ enables a still higher light use efficiency to be achieved while ensuring a higher uniformity.

While the light source 12 is preferably disposed such that the light emission faces 40a are directed toward the light exit plane as in the embodiment under discussion, the present invention is not limited to such configuration. The light emission faces 40a of the light source 12 may be directed toward the first inclined plane 18b or the second inclined plane 18c.

Now, the planar lighting device 10 will be described in greater detail below by referring to specific examples thereof. Because the examples of the planar lighting device now to be described are symmetrical with respect to the bisector α mentioned above, description that follows will be made solely on the side of the planar lighting device comprising the first light entrance plane as a representative.

In the examples of the planar lighting device now to be described, each light emission face 40a of the LED chips 40 measured 2.5 mm in the direction perpendicular to the direction in which the LED chips 40 are arrayed, the LED chips 40 measured 0.5 mm in thickness w1, the array base 42 measured 3.0 mm in length d2 in the direction perpendicular to the direction in which the LED chips 40 are arrayed and 0.5 mm in thickness w2, the first light entrance plane 18d of the light guide plate 18 measured 2.0 mm in length d1 thereof in effective cross section, and the length guide plate 18 overlap, i.e., the distance L between the light entrance plane 18d and the end of the upper light guide reflection plate 34 closer to the center of the light guide plate 18, measured 5 mm. A reflection film measuring 0.1 mm in thickness and having a reflectance of 98% was used to provide the reflection plate 24 and the lower light guide reflection plate 36; a reflection film measuring 0.1 mm in thickness and having a reflectance of 90% was used to provide the upper light guide reflection plate 34. Note that the reflection plate 24 and the lower light guide reflection plate 36 are formed of a single reflection film, which is bent at their joint, where the first light guide entrance plane 18*d* is located at the end of the light guide plate 18.

The light using efficiency of the light sources of the planar lighting devices was measured by varying the inclination angle θ of the light emission faces 40*a* of the LED chips 40 of the light sources 12 of the planar lighting device with the configuration as described above among 15°, 30°, 45°, 60°, and 75°.

Figure 15A:
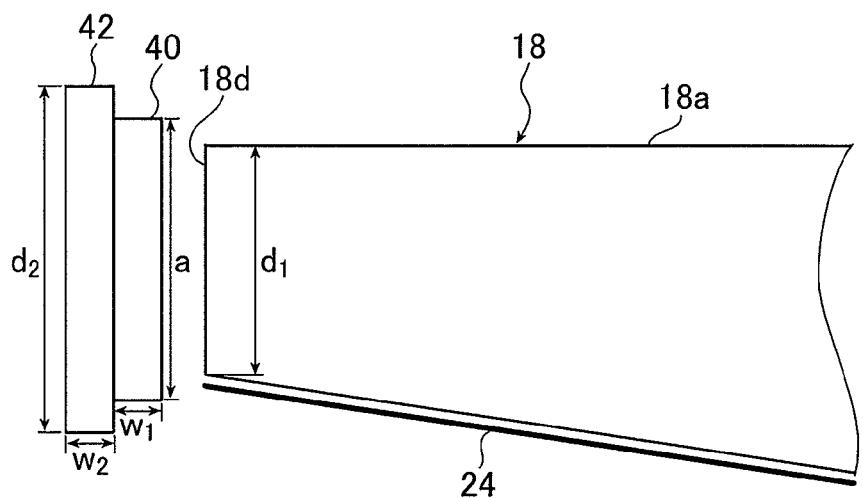
FIGS. 15A and 15B are enlarged sectional views schematically illustrating configurations of examples of planar lighting devices used for comparison with the inventive planar lighting device.
Figure 15B:
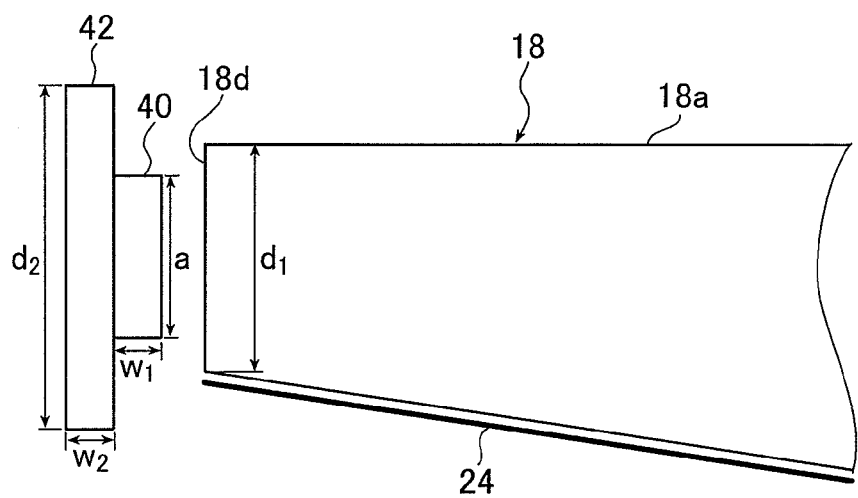

For comparison, light use efficiency observed in the light source of a comparative example 1 of the planar lighting device as illustrated in FIG. 15A was also measured, where θ=0°, that is, the light emission faces 40*a* were disposed in a position or at an angle such that the light emission faces 40*a* were parallel to the reference plane S. Also measured for comparison was light use efficiency observed in the light source of a comparative example 2 as illustrated in FIG. 15B, where the length "a" of the light emission faces 40*a* of the LED chips 40 in the direction perpendicular to the direction in which the LED chips 40 are arrayed measured 1.45 mm, and θ=0°. Note that although the fluorescent member 17 is not shown in FIGS. 15A and 15B to clearly indicate the dimension line, the fluorescent member 17 is disposed in contact with the light emission faces 40*a* of the LED chips 40 as illustrated in FIG. 3.

The measurements obtained are shown in Table 2 below and in FIG. 16.

TABLE 2

| θ | Examples | | | | | Comparative example 1 | Comparative example 2 |
|---|---|---|---|---|---|---|---|
| | 15 | 30 | 45 | 60 | 75 | 0 | 0 |
| Light use efficiency | 57% | 54% | 51% | 49% | 48% | 45% | 51% |

Figure 16:
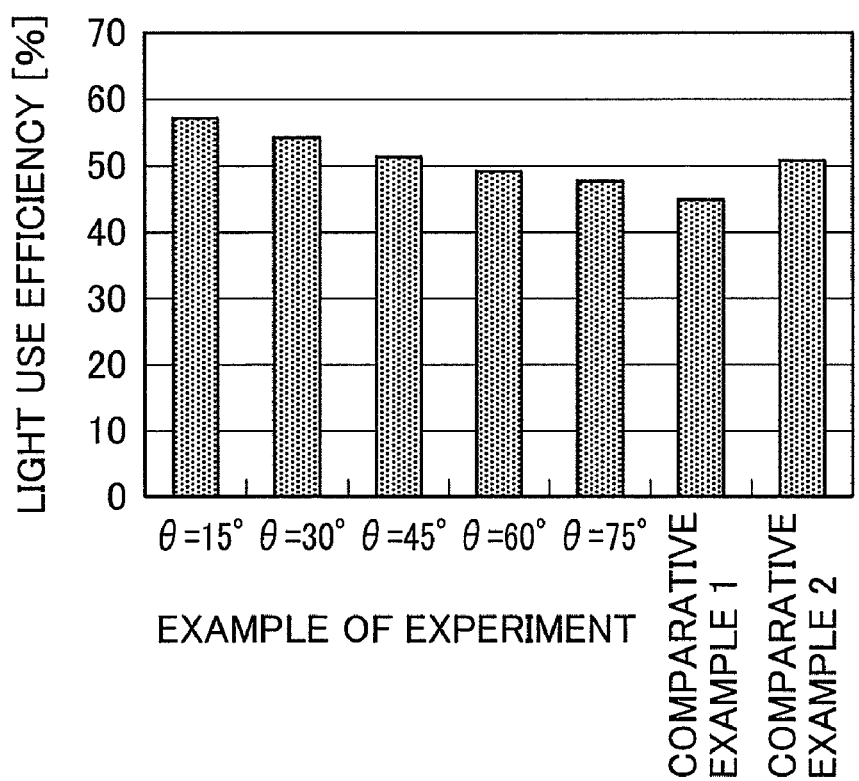
FIG. 16 is a graph illustrating measurements of light use efficiency achieved by the inventive planar lighting device as an inclination angle θ of the light emission face was varied.

Table 2 and FIG. 16 show that higher light use efficiency is achieved by tilting the light emission faces of the light source by a given angle than where the light emission faces 40*a* are disposed in a position or at an angle such that the light emission faces 40*a* are parallel to the reference plane S. Thus, more light can be admitted into the light guide plate and the brightness or illuminance of light emitted through the light exit plane of the light guide plate can be increased.

Further, the measurements show that the examples where the light emission faces 40*a* are tilted to an inclination angle θ of 15°≦θ≦45° achieve higher light use efficiencies than the comparative example 2 where the LED chips 40 are each provided with the light emission faces 40*a* of which the length "a" in the direction perpendicular to the direction in which the LED chips 40 are arrayed is shorter than the length of the light entrance plane in effective cross section.

Thus, light emitted by the light source can be admitted more efficiently into the light guide plated and light having a higher brightness and a higher illuminance can be emitted through the light exit plane by adjusting the inclination angle θ of the light emission faces 40*a*.

Next, another embodiment of the planar lighting device will be described.

Figure 17:
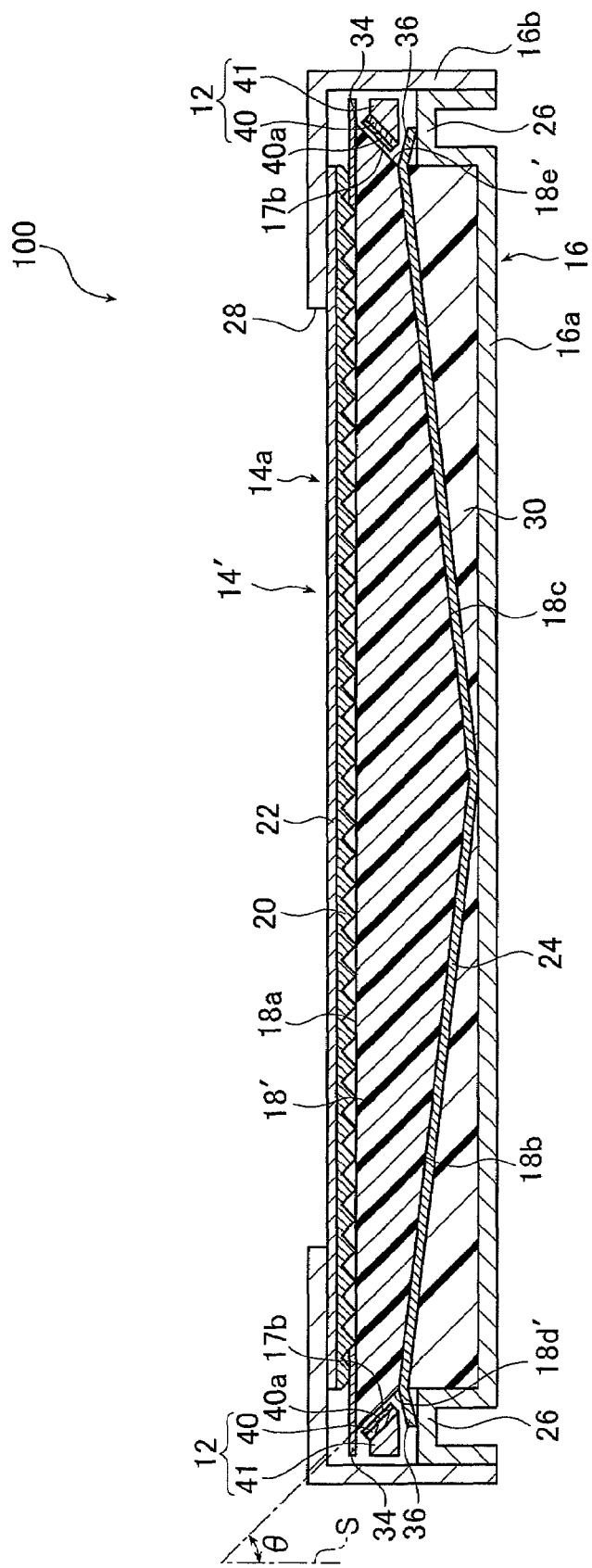
FIG. 17 is a sectional view schematically illustrating a configuration of another embodiment of the inventive planar lighting device.
Figure 18:
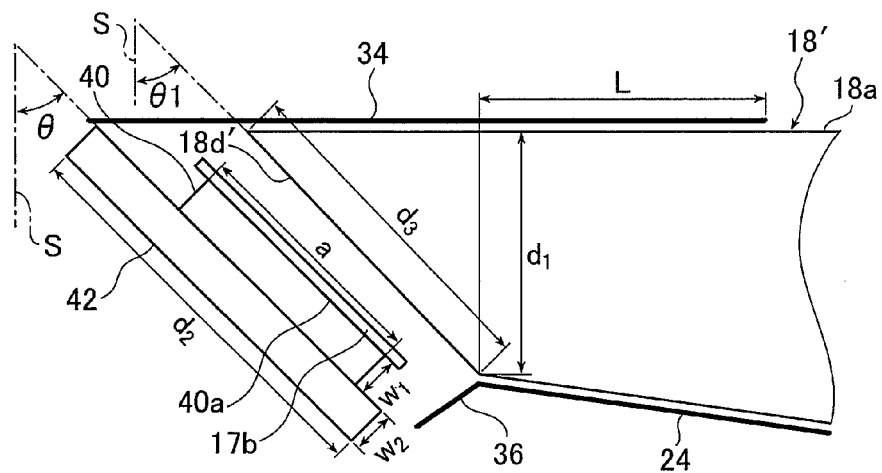
FIG. 18 is an enlarged sectional view illustrating part of the planar lighting device of FIG. 17 enlarged.

FIG. 17 is a sectional view schematically illustrating another embodiment of the inventive planar lighting device; FIG. 18 is an enlarged sectional view illustrating part of the planar lighting device of FIG. 17 enlarged.

A planar lighting device 100 illustrated in FIGS. 17 and 18 has the same configuration as the planar lighting device 10 of FIGS. 1 to 3 except for the configuration of a first light entrance plane 18*d*' and a second light entrance plane 18*e*' of a light guide plate 18'. Therefore, the same components shared by both are given like reference characters, omitting detailed description thereof. Thus, description that follows will be focused on features unique to the planar lighting device 100.

The planar lighting device 100 comprises the light sources 12, a main body 14' of the lighting device that emits uniform light through the rectangular light exit plane 14*a*, fluorescent members 17*b* provided between the light sources 12 and the main body 14' of the lighting device, and the housing 16 accommodating the light sources 12, the main body 14' of the lighting device, and the fluorescent members 17*b*. The main body 14' of the lighting device comprises a light guide plate 18', the prism sheet 20, the diffusion film 22, the reflection plate 24, the upper light guide reflection plates 34, and the lower light guide reflection plates 36. Since the light sources 12, the housing 16, the prism sheet 20, the diffusion film 22, the reflection plate 24, the upper light guide reflection plates 34, and the lower light guide reflection plates 36 have the same configuration as in the planar lighting device 10 described above, these components will not be described in detail here.

As illustrated in FIGS. 17 and 18, the light guide plate 18' comprises the flat, substantially rectangular light exit plane 18*a*; two light entrance planes, i.e., the first light entrance plane 18*d*' and the second light entrance plane 18*e*', provided on both sides of the light exit plane 18*a* at a given angle θ1 with respect to the reference plane S; the two inclined planes, i.e., the first inclined plane 18*b* and the second inclined plane 18*c*, provided on the opposite side from the light exit plane 18*a* in symmetry to each other with respect to the bisector α (see FIG. 1) that is parallel to the first light entrance plane 18*d*' and the second the light entrance plane 18*e*' and bisecting the light exit plane 18*a*, and inclined a given angle with respect to the light exit plane 18*a*. The first inclined plane 18*b* and the second inclined plane 18*c* are so inclined as to be farther distanced from the light exit plane 18*a* with the increasing distance from the first light entrance plane 18*d*' or the second light entrance plane 18*e*'. Expressed otherwise, the first inclined plane 18*b* and the second inclined plane 18*c* are inclined such that the thickness of the light guide plate in the direction perpendicular to the light exit plane of the light guide plate increases from the first light entrance plane 18*d*' and the second light entrance plane 18*e*' toward the center. Thus, the light guide plate 18' is thinnest at both ends, i.e., the first light entrance plane 18*d*' and the second light entrance plane 18*e*', and thickest at the center or on the bisector α where the first inclined plane 18*b* and the second inclined plane 18*c* meet. The inclination angle by which the first inclined plane 18*b* and the second inclined plane 18*c* are inclined with respect to the light exit plane 18*a* is not limited specifically.

The light sources 12 are disposed opposite the first light entrance plane 18*d*' and the second light entrance plane 18*e*'. Thus, the planar lighting device 100 is configured such that the two light sources 12 are disposed on both sides of the light guide plate 18'. Expressed otherwise, the light guide plate 18' is placed between the two light sources 12 spaced apart from each other by a given distance.

The planar lighting device 100 is also symmetrical with respect to the bisector α as is the planar lighting device 10 described above. Therefore, solely the side of the planar lighting device comprising the first light entrance plane will be described as a representative.

In the planar lighting device 100 according to the embodiment under discussion, the inclination angle θ1 of the first light entrance plane 18d' with respect to the reference plane S is, as illustrated in FIG. 18, the same as the inclination angle θ of the light emission faces 40a of the LED chips 40 of the light source 12 disposed opposite the first light entrance plane 18d' with respect to the reference plane S. Thus, the first light entrance plane 18d' and the light emission faces 40a are parallel.

Where, as with the embodiment under discussion, the first light entrance plane 18d' is tilted a given angle with respect to the reference plane S, light having an increased color temperature can be emitted through the light exit plane 14a by providing the fluorescent member 17b on the light emission faces 40a of the LED chips 40 of the light source 12, whereas, furthermore, light having a desired color temperature can be emitted through the light exit plane 14a by adjusting the shape of the blue color passing areas, i.e., the apertures or the transparent areas. Note that also in the embodiment under discussion, the fluorescent member 17b may be located in any position between the light emission faces of the LED chips and the light entrance plane of the light guide plate. For example, the fluorescent member 17b may be disposed in contact or in close contact with the light entrance plane.

With the first light entrance plane 18d' of the light guide plate 18 tilted the given angle θ1 with respect to the reference plane S, the surface area of the first light entrance plane 18d' acquires a larger surface area than the area of the effective cross section of the first light entrance plane 18d'. Thus, light emitted through the light emission faces 40a of the light source 12 can be efficiently admitted into the light guide plate 18'.

Where the first light entrance plane 18d' is tilted as in the embodiment under discussion, the effective cross section of the light entrance plane is the cross section perpendicular to the light exit plane 18a and containing the side of the first light entrance plane 18d' closer to the light exit plane 18a, i.e., the line or the joint where the first light entrance plane 18d' and the light exit plane 18a meet.

Further, where, as with the embodiment under discussion, the first light entrance plane 18d' of the light guide plate 18 is positioned parallel to the light emission faces 40a of the light source 12 or where, expressed otherwise, the first light entrance plane is tilted with respect to the reference plane S by an inclination angle identical to that of the light emission faces of the light source provided opposite the first light entrance plane, light emitted from the light emission faces 40a is allowed to strike the first light entrance plane 18d' efficiently.

While the inclination angle θ1 of the first light entrance plane 18d' is preferable identical to the inclination angle θ of the light emission faces 40a of the light source 12, the present invention is not limited to such configuration. The inclination angle θ1 may be different from the inclination angle θ. Thus, the light emission faces 40a may be positioned at a given angle with respect to the first light entrance plane 18d'.

Now, the planar lighting device 100 will be described in greater detail by referring to specific examples.

In the examples of the planar lighting device 100 now to be described, each light emission face 40a of the LED chips 40 measured 2.5 mm in the direction perpendicular to the direction in which the LED chips 40 are arrayed, the LED chips 40 measured 0.5 mm in thickness w1, the array base 42 measured 3.0 mm in length d2 perpendicular to the direction in which the LED chips 40 are arrayed and 0.5 mm in thickness w2, the first light entrance plane 18d' of the light guide plate 18' measured 2.0 mm in length d1 thereof in effective cross section, the length of the first light entrance plane 18d', i.e., the length d3 of the light entrance plane 18d' connecting the light exit plane 18a and the first inclined plane 18b measured (2.0/cos θ1), and the length in which the upper light guide reflection plate 34 and the light exit plane 18a of the light guide plate 18' overlap, i.e., the distance L between the first light entrance plane 18d' and the end of the upper light guide reflection plate 34 closer to the center of the light guide plate 18', measured 5 mm. A reflection of 98% was used to provide the reflection plate 24 and the lower light guide reflection plate 36; a reflection film measuring 0.1 mm in thickness and having a reflectance of 90% was used to provide the upper light guide reflection plate 34. Note that the reflection plate 24 and the lower light guide reflection plate 36 are formed of a single reflection film, which is bent at their joint, where the first light guide entrance plane 18d of the light guide plate 18' is located.

The light emission faces 40a of the light source 12 were positioned parallel to the first light entrance plane 18d' of the light guide plate 18' or, expressed otherwise, the inclination angle θ of the light emission faces 40a was the same as the inclination angle θ1 of the first light entrance plane 18d'.

The light use efficiency of the light sources of the planar lighting device thus configured was measured with the inclination angle θ of the light emission faces 40a and the inclination angle θ1 of the first light entrance plane set to the same angle, thus θ=θ1, varying θ among 15°, 30°, 45°, 60°, and 74°.

As in the preceding examples, light use efficiency observed in the comparative example 1 of the planar lighting device was measured for comparison, where θ=0°, that is, the light emission faces 40a were disposed in a position or at an angle such that the light emission faces 40a were parallel to the reference plane S, as illustrated in FIG. 15A. Also measured for comparison was light use efficiency observed in the comparative example 2 as illustrated in FIG. 15B, where the length "a" of the light emission faces 40a of the LED chips 40 in the direction perpendicular to the direction in which the LED chips 40 are arrayed measured 1.45 mm, and θ=0°.

Figure 19:
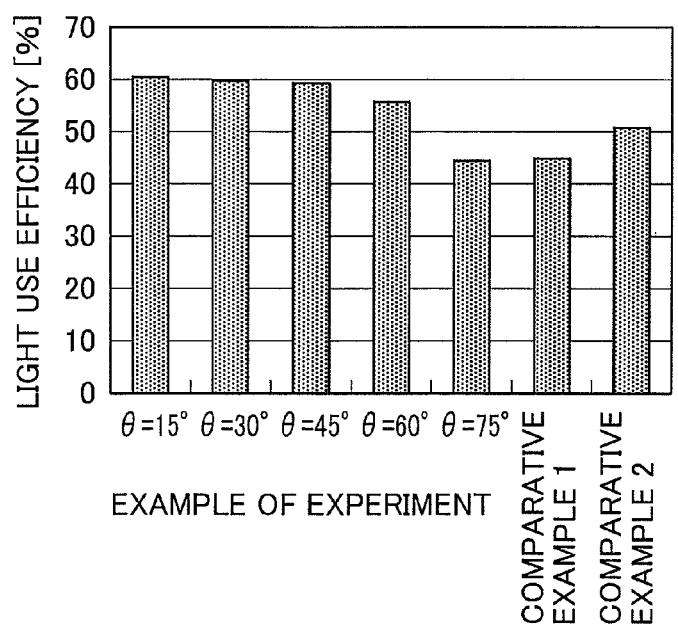
FIG. 19 is a graph illustrating measurements of light use efficiency achieved by the inventive planar lighting device as the inclination angle θ of the light emission face was varied.

Table 3 and FIG. 19 show the measurements obtained as follows.

TABLE 3

|  | Examples | | | | | Comparative example 1 | Comparative example 2 |
|---|---|---|---|---|---|---|---|
| θ | 15 | 30 | 45 | 60 | 75 | 0 | 0 |
| θ1 | 15 | 30 | 45 | 60 | 75 | 0 | 0 |
| Light use efficiency | 60% | 60% | 59% | 55% | 44% | 45% | 51% |

Table 3 and FIG. 19 show that where the light emission faces of the light source and the light entrance plane of the light guide plate are tilted a given angle, substantially the same light use efficiency is achieved as where the light emission faces 40a are disposed in a position or at an angle such that the light emission faces 40a are parallel to the reference plane S, or a higher light use efficiency is achieved than where the light emission faces 40a are disposed in a position such that the light emission faces 40a are parallel to the reference plane S. Further, where the light source is disposed with an inclination, a larger light source can be provided, although the light sources having the same dimensions were used in the above examples. Thus, more light can be admitted into the light guide plate and the brightness or illuminance of light emitted through the light exit plane can be increased.

Further, the measurements show that the examples, where the inclination angle θ of the light emission faces 40*a* and the inclination angle θ1 of the first light entrance plane are such that θ=θ1 and 15°≦θ≦60°, achieve higher light use efficiencies than the comparative example 2, where the LED chips 40 are provided with the light emission faces 40*a* of which the length "a" in the direction perpendicular to the direction in which the LED chips 40 are arrayed is shorter than the length of the light entrance plane in effective cross section.

Thus, light emitted by the light source can be admitted more efficiently into the light guide plate and light having a higher brightness and a higher illuminance can be emitted through the light exit plane by adjusting the inclination angle θ of the light emission faces and the inclination angle θ1 of the first light entrance plane.

Next, some other specific examples will be described.

In the examples to follow, brightness (cd/m$^2$), illuminance (lx), light use efficiency (%), and average brightness (cd/m$^2$) of light emitted through the light exit plane were measured at individual positions in each of the planar lighting devices that had substantially the same configuration as the examples of the planar lighting device 10 earlier described, where θ=45° and the distance L between the first light entrance plane 18*d* and the end of the upper light guide reflection plate 34 closer to the center of the light guide plate 18 measured 5 mm.

Further, brightness (cd/m$^2$), illuminance (lx), light use efficiency (%), and average brightness (cd/m$^2$) of the light emitted through the light exit plane were measured at individual positions in each of the planar lighting devices that had substantially the same configuration as the examples of the planar lighting device 100 described above, except that θ=θ1=45° and the distance L between the first light entrance plane 18*d'* and the end of the upper light guide reflection plate 34 closer to the center of the light guide plate 18 respectively measured 5 mm and 10 mm. For comparison, brightness (cd/m$^2$), illuminance (lx), light use efficiency (%), and average brightness (cd/m$^2$) of light emitted through the light exit plane of a comparative example 3 were also measured at individual positions thereof, where the light reflection plate was not provided and the light entrance plane of the light guide plate and the light emission faces of the light sources were parallel to the reference plane.

Figure 20:
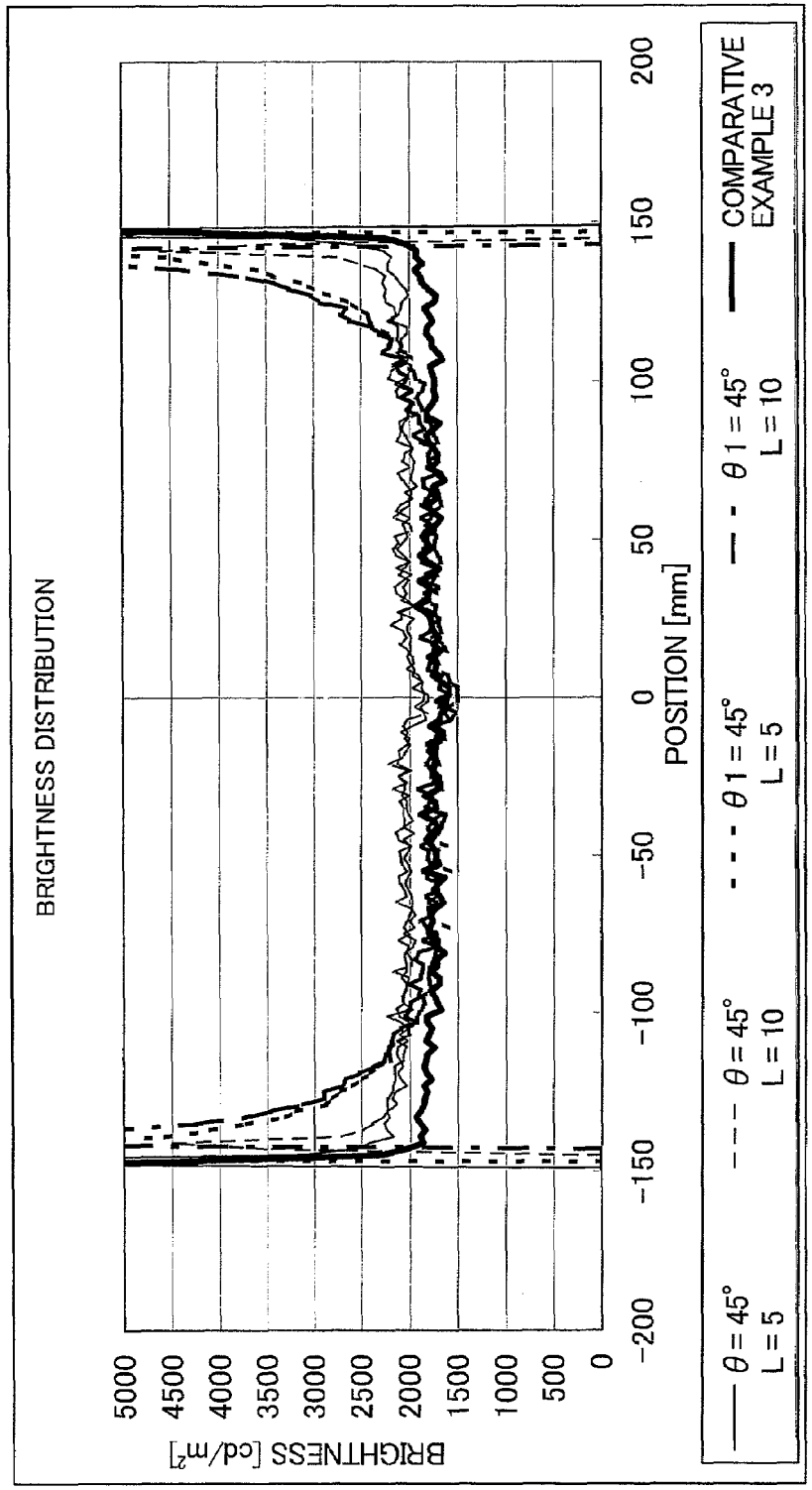
FIG. 20 is a graph illustrating brightness distributions of light emitted through the light exit plane of the inventive planar lighting device as the inclination angle of the light emission face and the light entrance plane and a mounting length of upper light guide reflection plates were varied.
Figure 21:
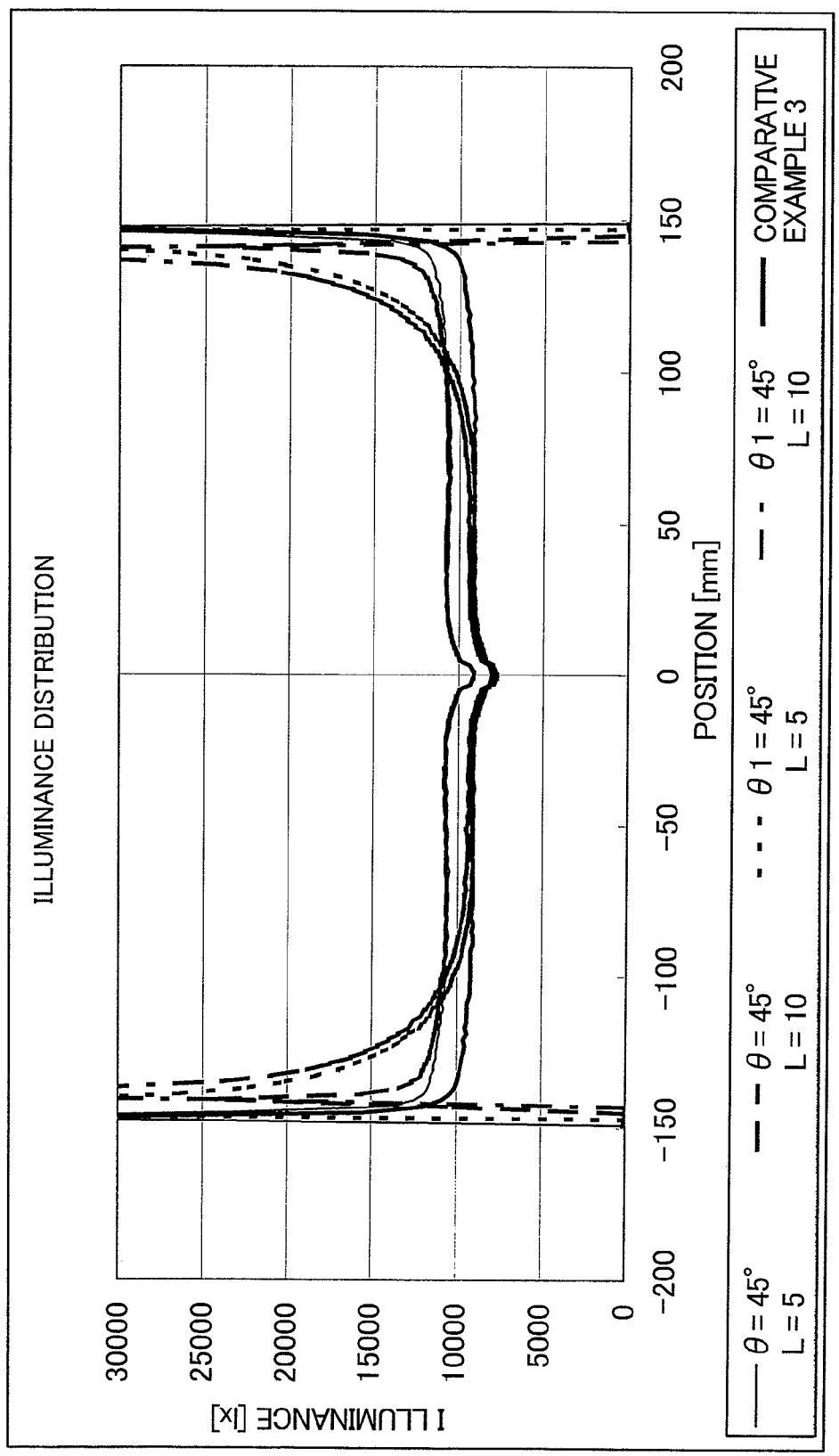
FIG. 21 is a graph illustrating illuminance distributions of light emitted through the light exit plane of the inventive planar lighting device as the inclination angle of the light emission face and the light entrance plane and the mounting length of the upper light guide reflection plates were varied.

FIG. 20 shows measured brightness distributions, and FIG. 21 shows measured illuminance distributions. In FIG. 20, the vertical axis shows brightness (cd/m$^2$) and the horizontal axis shows the distance (mm) from the center of the light guide plate. In FIG. 21, the vertical axis shows illuminance (lx) and the horizontal axis shows the distance (mm) from the center of the light guide plate.

Table 4 shows the light use efficiency (%) and average brightness (cd/m$^2$).

TABLE 4

|  | Examples | | | Comparative example 3 |
|---|---|---|---|---|
| θ | 45 | 45 | 45 | 0 |
| θ1 | 0 | 45 | 45 | 0 |
| L | 5 | 5 | 10 | 0 |
| Light use efficiency | 50.70% | 57.70% | 52.00% | 48.70% |
| Average brightness | 2160 | 2418 | 2332 | 2073 |

Table 4 shows that the examples of the present invention are capable of higher average brightness and light use efficiency than the comparative example 3.

Further, FIGS. 20 and 21 show that the examples of the present invention are capable of higher brightness and illuminance at individual positions closer to the center of the light guide plate than the comparative example 3.

It is also shown that a higher average brightness is achieved when the upper light guide reflection plate is given a length L of 5 mm.

The foregoing clearly shows the effects achieved by the present invention.

Now, still other embodiments of the inventive planar lighting device will be described below.

Figure 22A:
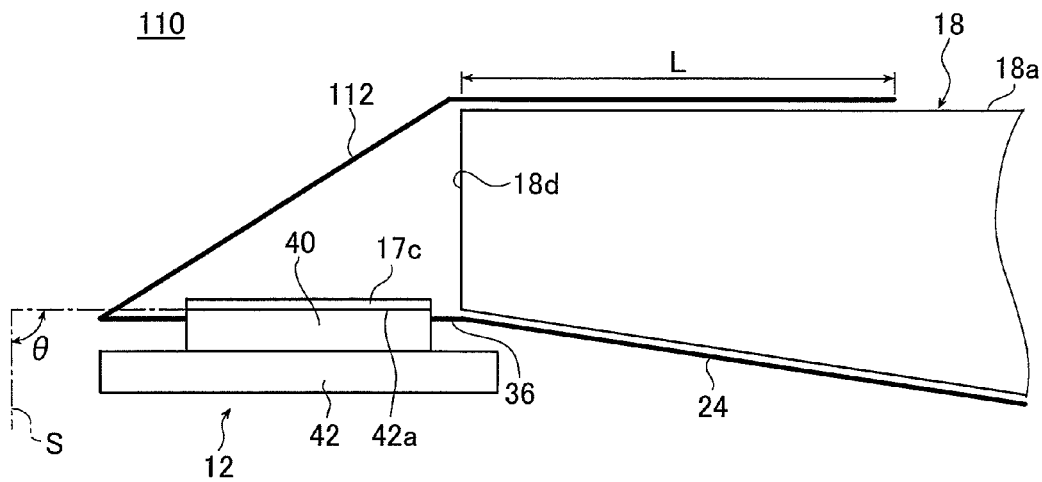
FIGS. 22A and 22B are enlarged sectional views schematically illustrating configurations of other examples of the inventive planar lighting device.
Figure 22B:
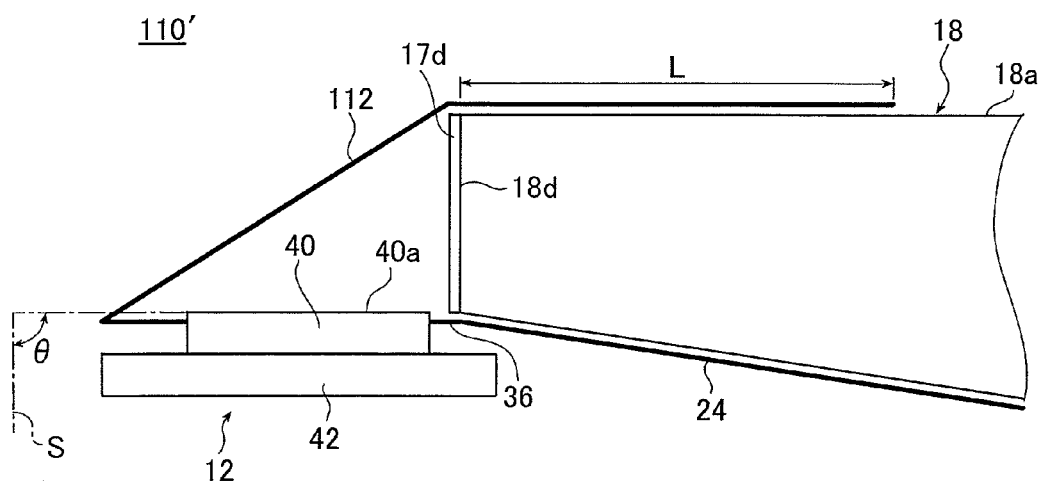
Figure 23:
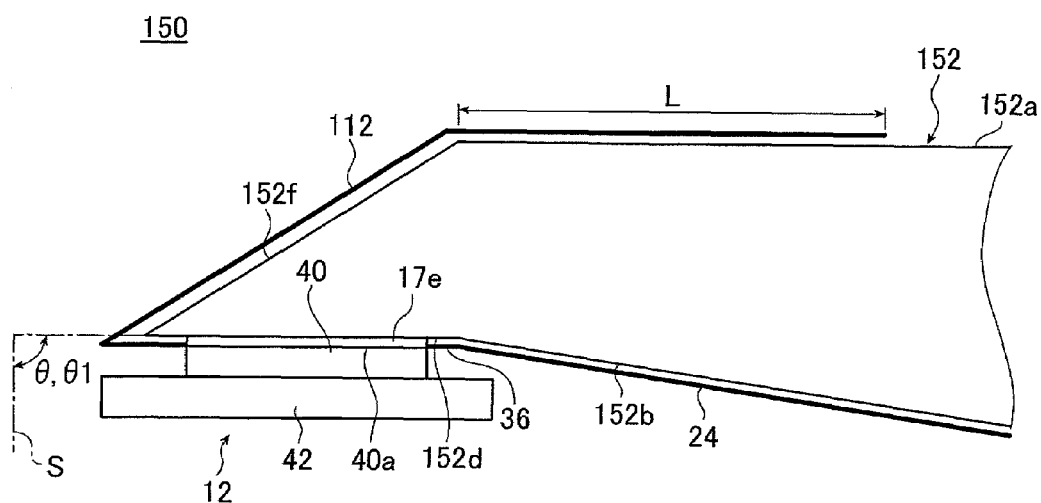
FIG. 23 is an enlarged sectional view schematically illustrating a configuration of another example of the inventive planar lighting device.

FIGS. 22A, 22B, and 23 are enlarged sectional views illustrating other embodiments of the inventive planar lighting device. A planar lighting device 110 of FIG. 22A, a planar lighting device 110' of FIG. 22B, and a planar lighting device 150 of FIG. 23 are also bilaterally symmetrical as are the planar lighting device 10 and the planar lighting device 100. Description will therefore be given referring solely to one side thereof.

The planar lighting device 110 illustrated in FIG. 22A has basically the same configuration as the planar lighting device 10 except that the light emission faces 40*a* are tilted an inclination angle θ of 90° with respect to the reference plane S.

The light source 12 of the planar lighting device 110 is disposed such that the light emission faces 40*a* of the LED chips 40 are positioned at an inclination angle θ of 90° or, otherwise expressed, the light emission faces 40*a* are disposed perpendicular to the first light entrance plane 18*d*. The LED chips 40 are provided on the side of the first light entrance plane 18*d* closer to the first inclined plane 18*b*.

A fluorescent member 17*c* is disposed in contact with the light emission faces 40*a* of the LED chips 40. The shape of the fluorescent member 17*c* is the same as the fluorescent member 17 already described above, and, hence, is not described here.

An upper light guide reflection plate 112 is a sheet member bent at the end of the light exit plane 18*a* of the light guide plate 18 and covers an area from part of the light exit plane 18 of the light guide plate 18 as far as the end of the light emission faces 40*a* of the LED chips 40 farther from the first light entrance plane 18*d*. Note that the upper light guide reflection plate 112 may be formed of the same material as the upper light guide reflection plate 34 earlier described.

In the planar lighting device 110, light is emitted by the light source 12, then transmitted through the fluorescent member 17*c*, and, either directly or after being reflected by the upper light guide reflection plate 112, enters the light guide plate 18 through the first light entrance plane 18*d*. Light thus admitted into the light guide plate 18 is emitted through the light exit plane as with the planar lighting device 10.

The color temperature of light emitted through the light exit plane 14*a* can be increased also with the embodiment under discussion by providing a fluorescent member 17*c* on the light emission faces 40a of the LED chips 40 of the light source 12. Further, light can be emitted through the light exit plane 14a with a desired color temperature by adjusting the shape of the blue light passing areas, i.e., the apertures or the transparent areas.

Thus, also where the light emission faces 40a are disposed at an inclination angle θ of 90°, light emitted by a light source having large light emission faces, for example, light emission faces each measuring longer than the length of the light entrance plane in effective cross section, can be efficiently caused to strike the light entrance plane, thus improving the light use efficiency. Further, where the light emission faces are disposed at an inclination angle θ of 90°, each light emission face can be given a larger area, which in turn helps increase the brightness or illuminance of light emitted through the light exit plane.

Also with the embodiment under discussion, the position in which the fluorescent member is provided is not limited specifically: a fluorescent member 17d may for example be located in such a position as to be in contact with the first light entrance plane 18d of the light guide plate 18 of a planar lighting device 110' as illustrated in FIG. 22B.

A planar lighting device 150 of FIG. 23 has the same configuration as the planar lighting device 110 of FIG. 22A except for the shape of a light guide plate 152.

The light guide plate 152 comprises a flat, substantially rectangular light exit plane 152a; two lateral planes on both sides of a light exit plane 152a, i.e., a first lateral plane 152f and a second lateral plane 152g, formed at a given inclination angle with respect to the light exit plane 152a; two inclined planes i.e., a first inclined plane 152b and a second inclined plane 152c, symmetrical with respect to the bisector α (see FIG. 1) bisecting the light exit plane 152a; two light entrance planes, i.e., a first light entrance plane 152d and a second light entrance plane 152e, formed between one end of the respective inclined planes and one end of the respective lateral planes. In the light guide plate 152, the light exit plane 152a and the first lateral plane 152d form an angle greater than 90° whereas the first light entrance plane 152d and the first lateral plane 152f form an angle smaller than 90°. The first light entrance plane 152d is disposed at an inclination angle θ1 of 90° with respect to the reference plane S.

The effective cross section of the light entrance plane in the embodiment under discussion is the cross section containing the side of the first light entrance plane 152d closer to the first inclined plane 152b and substantially perpendicular to the light exit plane 152a of the light guide plate 152.

Note that, because the planar lighting device 150 is bilaterally symmetrical, FIG. 23 only illustrates an end portion thereof closer to the first lateral plane 152f.

The light source 12 comprises LED chips 40 and the light source mount 41 and is disposed opposite the first light entrance plane 152d formed between the first inclined plane 152b and the first lateral plane 152f of the light guide plate 152.

The light source 12 is located in a position such that the light emission faces 40a have an inclination angle θ of 90° with respect to the reference plane S. Thus, the light emission faces 40a and the first light entrance plane 152d are parallel to each other.

The upper light guide reflection plate 112 is so disposed as to partially cover the light guide plate 152 by contouring part of the light exit plane 152a bordering on the first lateral plane 152f and the first lateral plane 152f. The end of the upper light guide reflection plate 112 closer to the first lateral plane 152f of the light guide plate 152 connects with the light source 12.

The light guide plate 152 is provided with the lower light guide reflection plate 36 and the reflection plate 24 on the side thereof closer to the first inclined plane 152b.

Thus, part of the light exit plane 152a bordering on the first lateral plane 152f, the first lateral plane 152f, the first light entrance plane 152d, and the first inclined plane 152b of the light guide plate 152 are covered all the way through with the upper light guide reflection plate 112, the light source 12, the lower light guide reflection plate 36, and the reflection plate 24. In the embodiment under discussion, the reflection plate 24 and the lower light guide reflection plate 36 are formed integrally.

A fluorescent member 17e is disposed between the light entrance plane 152d and the light emission faces 40a of the LED chips. The fluorescent member 17e has the same configuration as the fluorescent member 17 already mentioned and, therefore, is not described in detail here.

Light emitted through the light emission faces 40a of the light source 12 is transmitted through the fluorescent member 17e, and enters the light guide plate 152 through the first light entrance plane 152d of the light guide plate 152. Light thus admitted then travels toward the center of the light guide plate 152 either directly or after being reflected by the upper light guide reflection plate 112.

As with the light guide plate 18 described earlier, light traveling toward the center of the light guide plate 152 passes through the inside of the light guide plate 152 as it is scattered by the scatterers contained inside the light guide plate 152 and, directly or after being reflected by the first inclined plane 152b and the second inclined plane 152c, exits through the light exit plane 152a. The scatterers will be described later in detail.

The color temperature of light emitted through the light exit plane 14a can be increased also with the embodiment under discussion by providing a fluorescent member 17e on the light emission faces 40a of the LED chips 40 of the light source 12. Further, light can be emitted through the light exit plane 14a with a desired color temperature by adjusting the shape of the blue light passing areas, i.e., the apertures or the transparent areas.

Further, light emitted by the light source can be also efficiently admitted into the light guide plate and light use efficiency can be increased by tilting both the light emission faces of the light source and the light entrance plane of the light guide plate by a given angle with respect to the reference plane and providing the lateral plane between the light entrance plane and the light exit plane of the light guide plate.

Further, light emission faces can be each given a larger area and light with a high brightness or high illuminance can be emitted through the light exit plane by providing the lateral plane and locating the light entrance plane on the side closer to the inclined plane. Furthermore, light free from unevenness can be emitted through the light exit plane also where light is admitted through the light entrance plane located on the side closer to the inclined plane by reflecting light admitted through the light entrance plane with the lateral plane titled a given angle.

Further, light admitted through the light entrance plane can be reflected by the lateral plane by providing the lateral plane. Thus, also where the light entrance plane is provided at a great inclination angle with respect to the reference plane, light admitted through the light entrance plane can be readily guided toward the center of the light guide plate.

Further, the light emission planes of the light source each acquire an increased area where the first light entrance plane 152d is disposed at an inclination angle θ1 of 90° with respect to the reference plane S, i.e., parallel to the light exit plane.

Also with the planar lighting device as described above that admits light through an end portion of the inclined plane of the light guide plate, the value $\Phi \cdot N_p \cdot L_G \cdot K_C$ is preferably in the range of not less than 1.1 and not greater than 8.2, and $K_C$ is preferably in the range of not less than 0.005 and not greater than 0.1, where: $\Phi$ is the scattering cross section of the scattering particles contained in the light guide plate 152; $L_G$ the distance in the direction parallel to the light exit plane 152a and perpendicular to the line where the light exit plane 152a crosses the lateral plane, i.e., the first lateral plane 152f or the second lateral plane 152g, from the point where the lateral plane and the light entrance plane of the light guide plate 152 meet, i.e., the end of the light guide plate, to a position where the light guide plate 152 is thickest or longest in the direction perpendicular to the light exit plane; $N_p$ the density of the scattering particles contained in the light guide plate 152, i.e., the number of particles in unit volume; and $K_C$ the compensation coefficient. The light guide plate 152, containing scattering particles satisfying the above relation, is capable of emitting uniform illuminating light with a greatly reduced level of brightness unevenness through the light exit plane 152a.

The same preferred configurations, shapes, and the like of the embodiments earlier described also apply where the lateral planes are provided. For example, the inclination angle $\theta = \theta 1$ is preferably in the range of $15° \leq \theta \leq 90°$.

Now, another embodiment of the inventive planar lighting device will be described in detail referring to specific examples.

The examples to follow have substantially the same dimensions and configuration as the planar lighting device 10 described above except that $\theta = 90°$, that is, the light emission faces 40a of the LED chips of the light source have such an inclination angle and the upper light guide reflection plate has such a shape as illustrated in the planar lighting device 110 and that the upper light guide reflection plate has a length L of 10 mm. Illuminance (lx) and light use efficiency (%) emitted through the light exit plane of the planar lighting device 110 were measured. Also measured for comparison were illuminance (lx) and light use efficiency (%) emitted through the light exit plane of a planar lighting device where $\theta = 45°$, the upper light guide reflection plate has a length L of 10 mm, and where the light entrance plane of the light guide plate is parallel to the reference plane.

Figure 24:
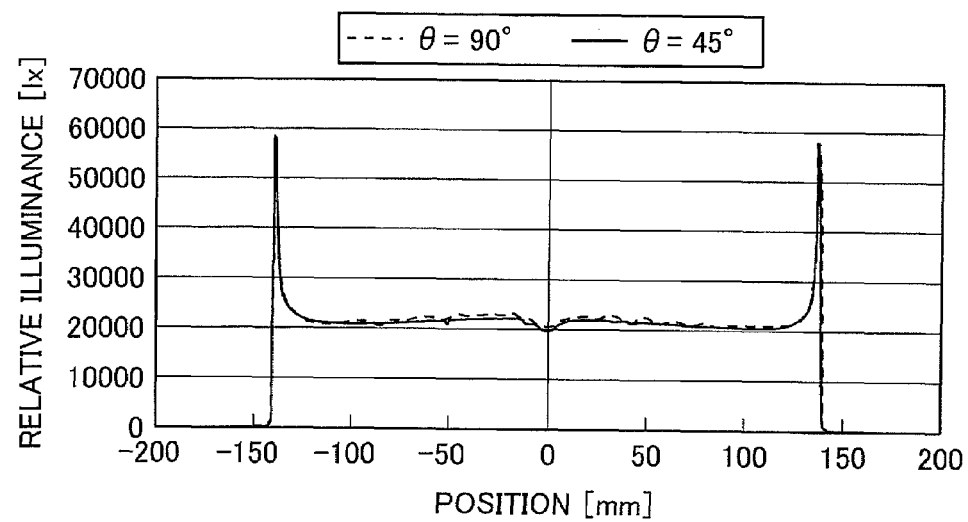
FIG. 24 is a graph illustrating the illuminance distribution of light emitted through the light exit plane of the planar lighting device of FIG. 22A.

FIG. 24 and Table 5 show the measurements obtained. FIG. 24 shows illuminance (lx) on the vertical axis and the distance (mm) from the center of the light guide plate on the horizontal axis.

TABLE 5

| | $\theta$ | |
|---|---|---|
| | 45 | 90 |
| Light use efficiency | 48.30% | 49.50% |

FIG. 24 and Table 5 show that high light use efficiency is also achieved when $\theta = 90°$ just as when $\theta = 45°$. FIG. 24 also shows that uniform light can be emitted from an area closer to the center of the light guide plate.

The planar lighting device as described above may be used as a planar lighting device for indoor and outdoor illumination, a backlight to illuminate a liquid crystal panel used in liquid crystal display devices, a backlight used in advertising panels, advertising towers, and advertising signs.

While the inventive planar lighting device is described above in detail, the present invention is not limited to the above embodiments, and various improvements and modifications may be made without departing from the spirit of the present invention.

All of the embodiments described above have the light guide plate support members 30 formed of, for example, a resin between the housing member 16a and the reflection plate 24 as illustrated in FIG. 2 so as to support the reflection plate 24 from the side thereof away from the first inclined plane 18b and the second inclined plane 18c of the light guide plate 18 to secure close contact between the light guide plate 18 and the reflection plate 24. The present invention is, however, not limited thereto.

There are preferably provided cushioning members on the side of the reflection plate 24 opposite from the light guide plate 18, i.e., between the housing body 16a and the reflection plate 24 in the embodiment under discussion. The cushioning members are a material having a lower rigidity than the light guide plate so as to deform according to the contour of the light guide plate. The cushioning members may be formed of a sponge, for example.

The cushioning members place the reflection plate 24 in close contact with the light guide plate 18, and prevent the reflection plate 24 from bending by supporting the reflection plate 24 and the light guide plate 18 on the side thereof defined by the first inclined plane 18b and the second inclined plane 18c. Further, where the light guide plate support members are formed with the cushioning members, the light guide plate and the reflection plate can be brought into contact with each other evenly throughout, which prevents diffuse reflection of light that would otherwise occur if only part of the reflection plate were in contact with the light guide plate. This prevents otherwise diffusely reflected light from being observed as bright light as it is emitted through the light exit plane and instead makes it possible to emit uniform light through the light exit plane.

FIGS. 25A to 25D are exploded sectional views illustrating examples of schematic configuration of the cushioning members supporting the light guide plate and the reflection plate.

Figure 25A:
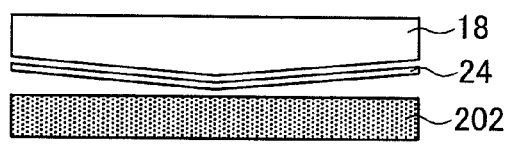
FIGS. 25A to 25D are exploded views illustrating examples of cushioning members for supporting the light guide plate and the reflection plate.

As illustrated in FIG. 25A, a rectangular cushioning member 202 may for example be provided on the side of the reflection plate 24 opposite from the light guide plate 18. The cushioning member 202 is preferably formed of a material having a maximum stress of 5 [N/cm$^2$] or less. The maximum stress here is a maximum of the stress that acts from the cushioning member 202 onto the light guide plate 18 as assembled to form the planar lighting device. In the embodiment under discussion, it is the stress that acts on the joint between the first inclined plane and the second inclined plane.

Figure 25B:
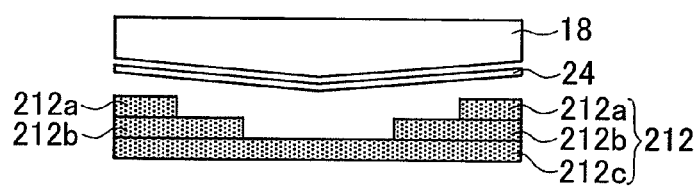

As illustrated in FIG. 25B, a multilayer cushioning member 212 consisting of cushioning pieces 212a, 212b, and 212c, so as to vary in thickness according to the shape of the light guide plate 18 may be provided on the side of the reflection plate 24 opposite from the light guide plate 18. Providing the cushioning member 212 that varies in thickness serves to reduce the compressibility of the cushioning member and reduce the maximum stress that acts on the light guide plate. Thus, the force acts on the light guide plate evenly, bringing the light guide plate and the reflection plate into close contact evenly throughout.

Figure 25C:
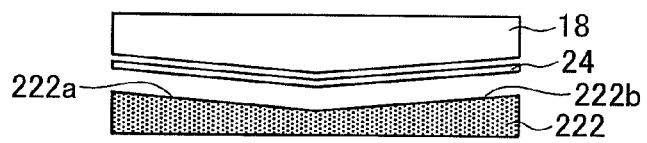

Alternatively, a cushioning member 222 may have a shape contouring the inclined planes of the light guide plate 18, as illustrated in FIG. 25C. That is, the cushioning member 222 has a shape formed of a first inclined plane 222a and a second inclined plane 222b with the same inclination angle as the first inclined plane and the second inclined plane of the light guide plate 18 on the side closer to the light guide plate 18.

Thus, the light guide plate and the reflection plate can be placed in close contact with each other evenly throughout by forming the cushioning member so as to contour the inclined planes of the light guide plate.

Figure 25D:
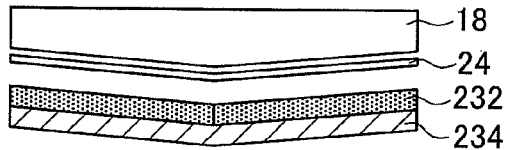

Alternatively, a cushioning member 232 having a shape contouring the inclined planes of the light guide plate 18 may be provided together with a sheet metal 234 contouring the inclined planes of the light guide plate 18 on the side of the cushioning member 232 opposite from the light guide plate 18, as illustrated in FIG. 25D.

Providing the sheet metal 234 contouring the inclined planes of the light guide plate 18 on the side of the cushioning member 232 opposite from the light guide plate 18 gives a uniform compressibility to the cushioning member throughout. Further, supporting the reflection plate via the cushioning member brings the light guide plate and the reflection plate into close contact.

While, in all the embodiments described above, the LED chips are arranged in a single row in one direction, the present invention is not limited to such configuration: the LED chips may be arranged in two or more rows or, in other words, the LED chips may be arranged in the form of a matrix.

While, in the embodiment under discussion, two or more LED chips are arranged in a row, the present invention is not limited to such configuration: only one LED chip may be provided. For example, the light exit plane may be formed by cutting out one of the four corners of the rectangular light guide plate to provide a light entrance plane, and a single LED chip may be disposed opposite the light entrance plane thus provided. This helps reduce the dimensions of the planar lighting device.

Further, while, in the embodiment of the planar lighting device under discussion, the light emission faces of the light sources are tilted a given angle with respect to the direction perpendicular to the light exit plane of the light guide plate for efficient use of light emitted by the light sources, the present invention is not limited to such configuration: the light emission faces of the light sources may be positioned perpendicular to the light exit plane of the light guide plate.

While the light guide plate preferably is shaped such that it grows thicker with the increasing distance from the light entrance planes because then the light guide plate is capable of allowing light to travel a longer distance and a larger planar lighting device is to be designed, the present invention is not limited to such configuration: the light guide plate may, for example, be shaped like a flat plate or may have a shape growing thinner with the increasing distance from the light entrance planes.

The light guide plate may be fabricated by mixing a plasticizer into a transparent resin.

Fabricating the light guide plate from a material prepared by mixing a transparent material and a plasticizer provides a flexible light guide plate, allowing the light guide plate to be deformed into various shapes. Thus, the surfaces of the light guide plate can be formed into various curved surfaces.

What is claimed is:

1. A planar lighting device comprising:
    a light source having at least one LED chip that emits blue light through a light emission face,
    a transparent light guide plate comprising at least one light entrance plane for admitting light emitted by said light source and a light exit plane for emitting light admitted through said at least one light entrance plane as planar light,
    a fluorescent member disposed between said light emission face and each of said at least one light entrance plane and comprising a fluorescent substance coated area for emitting white light by converting the blue light emitted through said light emission face into the white light and blue light passing areas for emitting the blue light emitted through said light emission face as the blue light.

2. The planar lighting device of claim 1, wherein said blue light passing areas are formed of a transparent film or apertures.

3. The planar lighting device of claim 1, wherein said light source comprises two or more LED chips and a mount for supporting said two or more LED chips, and wherein said two or more LED chips are arranged in an array on a surface of said mount facing each of said at least one light entrance plane.

4. The planar lighting device of claim 3, wherein said fluorescent member is a single sheet member common to the LED chips.

5. The planar lighting device of claim 1, wherein said fluorescent member has two or more blue light passing areas formed therein for said light emission face of each LED chip.

6. The planar lighting device of claim 1, wherein said fluorescent member is formed such that Sa and Sap satisfy a relation $0.05 \leq Sap/Sa \leq 0.40$, where Sa is a whole area of said fluorescent member and Sap is a sum of areas of all said blue light passing areas.

7. The planar lighting device of claim 1, wherein said at least one light entrance plane of said light guide plate is formed at an end of said light exit plane for emitting the planar light therethrough, is substantially perpendicular to said light exit plane and admits the light traveling parallel to said light exit plane, and wherein said light guide plate has a shape growing thicker in a direction perpendicular to said light exit plane with an increasing distance from said at least one light entrance plane.

8. The planar lighting device of claim 7, wherein the light guide plate contains scattering particles therein and satisfies following expressions:

$$1.1 \leq \Phi \cdot N_p \cdot L_G \cdot K_C \leq 8.2$$

$$0.005 \leq K_C \leq 0.1;$$

where $\Phi$ is a scattering cross section of said scattering particles; $N_p$ is a density of said scattering particles; $K_C$ is a compensation coefficient; and $L_G$ is a distance in an incident direction from said at least one light entrance plane of said light guide plate to a position where said light guide plate is thickest.

9. The planar lighting device of claim 7, wherein said at least one LED chip has said light emission face longer than a length of said at least one light entrance plane in an effective cross section passing through the end of said light exit plane at which said at least one light entrance plane is formed and lying in the direction substantially perpendicular to said light exit plane, and wherein said light emission face is disposed opposite said at least one light entrance plane of said light guide plate and tilted a given angle with respect to the direction substantially perpendicular to said light exit plane.

10. The planar lighting device of claim 9, wherein said at least one light entrance plane of said light guide plate is a plane substantially perpendicular to said light exit plane and the effective cross section of said at least one light entrance plane is said plane substantially perpendicular to said light exit plane.

11. The planar lighting device of claim 9,
wherein said at least one light entrance plane of said light guide plate is a plane inclined with respect to the direction substantially perpendicular to said light exit plane such that said at least one light entrance plane faces and is parallel to said light emission face of said light source and
wherein an effective cross section of each of said at least one light entrance plane is a cross section lying in a plane passing through a center of each of said at least one light entrance plane and substantially perpendicular to said light exit plane.

12. The planar lighting device of claim 9,
wherein an inclination angle of said light emission face of said light source with respect to the direction substantially perpendicular to said light exit plane is 15° to 90°.

13. The planar lighting device of claim 9, further comprising light guide reflection plates for guiding the light emitted by said light source to said at least one light entrance plane, disposed on a side of said at least one light entrance plane of said light guide plate closer to said light exit plane and on a side of said at least one light entrance plane opposite from said light exit plane.

14. The planar lighting device of claim 13,
wherein said light guide reflection plates comprise a first light guide reflection plate attached to an end of said light exit plane of said light guide plate and a second light guide reflection plate attached to an end of a plane of said light guide plate opposite from said light exit plane and having an extension extending farther outward from an end of said plane of said light guide plate opposite from said light exit plane.

15. The planar lighting device of claim 9,
wherein said light guide plate has a configuration such that said light exit plane is rectangular and said at least one light entrance plane of said light guide plate comprises a first light entrance plane and a second light entrance plane each formed on two opposite sides of said light exit plane, and
wherein said light guide plate is thinnest at said first light entrance plane and said second light entrance plane and thickest at a midpoint of a line connecting said first light entrance plane and said second light entrance plane.

* * * * *